(12) United States Patent
Seo et al.

(10) Patent No.: US 11,516,326 B2
(45) Date of Patent: Nov. 29, 2022

(54) SENSOR MODULE AND METHOD FOR OPERATING SAME

(71) Applicant: LG INNOTEK CO., LTD., Seoul (KR)

(72) Inventors: Sang Won Seo, Seoul (KR); Ki Chul Chang, Seoul (KR); Jeong Gi Seo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1101 days.

(21) Appl. No.: 16/088,123

(22) PCT Filed: Mar. 27, 2017

(86) PCT No.: PCT/KR2017/003263
§ 371 (c)(1),
(2) Date: Sep. 25, 2018

(87) PCT Pub. No.: WO2017/164717
PCT Pub. Date: Sep. 28, 2017

(65) Prior Publication Data
US 2020/0304618 A1    Sep. 24, 2020

(30) Foreign Application Priority Data

Mar. 25, 2016  (KR) ........................ 10-2016-0036068

(51) Int. Cl.
  *H04M 1/00*  (2006.01)
  *H04M 1/02*  (2006.01)
  *H05K 1/18*  (2006.01)
(52) U.S. Cl.
  CPC ....... *H04M 1/0274* (2013.01); *H04M 1/0277* (2013.01); *H05K 1/189* (2013.01); *H04M 2250/12* (2013.01)

(58) Field of Classification Search
  CPC ............. H04M 1/0274; H04M 1/0277; H04M 1/72403; H04M 1/026; H04M 2250/12;
  (Continued)

(56) References Cited

U.S. PATENT DOCUMENTS

2012/0236902 A1  9/2012  Nakamura et al.
2014/0140368 A1  5/2014  Yildizyan et al.
(Continued)

FOREIGN PATENT DOCUMENTS

JP   2011-149920 A   8/2011
KR   10-0769587 B1  10/2007
(Continued)

OTHER PUBLICATIONS

Search Report, dated Jul. 25, 2017, for International Application No. PCT/KR2017/003263.

*Primary Examiner* — Anatoly Vortman
*Assistant Examiner* — Zhengfu J Feng
(74) *Attorney, Agent, or Firm* — LRK Patent Law Firm

(57) ABSTRACT

A sensor module includes: a flexible printed circuit board; a temperature sensor disposed on the flexible printed circuit board to measure the temperature of a measurement object; a distance sensor disposed on the flexible circuit board adjacent to the temperature sensor to measure the distance to the measurement object; a terminal cover disposed above the temperature sensor and the distance sensor and including a first hole exposing a top surface of the temperature sensor and a second hole exposing a top surface of the distance sensor; and a window disposed in the second hole of the terminal cover.

18 Claims, 18 Drawing Sheets

(58) Field of Classification Search
CPC .............. H04M 2250/52; H05K 1/189; H05K 2201/10522; H05K 2201/10151; G01J 1/02; G01J 1/0238; G01J 3/46; G02B 6/32; G02B 6/325
USPC .................................................... 361/679.01
See application file for complete search history.

(56) References Cited

U.S. PATENT DOCUMENTS

| | | | |
|---|---|---|---|
| 2014/0140712 A1 | 5/2014 | Nakayama et al. | |
| 2014/0263973 A1* | 9/2014 | Geiger .................. | G01J 1/0271 |
| | | | 250/208.2 |
| 2015/0233762 A1* | 8/2015 | Goldring ............... | G01J 3/0229 |
| | | | 356/402 |
| 2015/0369669 A1 | 12/2015 | Kassovski et al. | |

FOREIGN PATENT DOCUMENTS

| | | | | |
|---|---|---|---|---|
| KR | 10-2013-0019515 A | 2/2013 | | |
| KR | 10-2015-0094861 A | 8/2015 | | |
| KR | 10-1558981 B1 | 10/2015 | | |
| KR | 10-2015-0146426 A | 12/2015 | | |
| KR | 10-2016-0016739 A | 2/2016 | | |
| WO | 2013/014707 A1 | 1/2013 | | |
| WO | WO-2013114834 A1 * | 8/2013 | ............ | G06F 1/1626 |
| WO | WO-2015133763 A1 * | 9/2015 | ............ | G01J 5/0205 |

\* cited by examiner (a)

DETAILED INFORMATION

TITLE : 20160306_181150
DATE AND TIME : 2016.3.6. PM 6:11

MEDIA TYPE : image/jpeg
RESOLUTION : 5312X2988
DIRECTION : 90°
FILE SIZE : 6.87MB
MANUFACTURER : LG Electronics
MODEL NAME : LG-F500K
FLASH :  TURN OFF
FOCAL LENGTH : 4.42mm
WHITE BALANCE : AUTO
APERTURE : 1.8
EXPOSURE TIME : 1/13
ISO : 400
FILE PATH : /storage/emulated/0/
DCIM/Carera/20160306_181150.jpg
OBJECT TEMPERATURE : 32°C

SENSOR MODULE AND METHOD FOR OPERATING SAME

CROSS-REFERENCE TO RELATED APPLICATIONS

The present application is a U.S. National Phase entry from International Application No. PCT/KR2017/003263, filed Mar. 27, 2017, which claims priority to Korean Patent Application No. 10-2016-0036068, filed Mar. 25, 2016, the disclosure of which is incorporated by reference herein in its entirety.

BACKGROUND

1. Technical Field

The present invention relates to a sensor module, and more particularly, to a sensor module capable of compensating a temperature value obtained via a temperature sensor according to a distance to a measurement object and a method for operating the same.

2. Description of Related Art

A general non-contact infrared sensor includes a first element for absorbing infrared rays radiated from a measurement object to generate an electrical signal, and a second element for sensing temperature by amplifying and filtering an electrical signal generated from the first element.

In addition, the infrared sensor includes a substrate for supporting the first element and the second element, a filter for transmitting a wavelength band of an infrared region only to perform optical focusing, and a protective cover for protecting parts such as the first element and the second element from an outside and blocking noise.

Meanwhile, recently, as a function of a mobile terminal has increased, mobile terminals equipped with the infrared sensor have been increasing.

FIG. 1 is a view for explaining an operation of an infrared sensor according to the related art, and FIG. 2 is diagram illustrating characteristics of measurement temperature according to the related art.

Referring to FIG. 1, the infrared sensor receives infrared rays according to a temperature generated from a measurement object, and measures a temperature of the measurement object based on the received infrared rays.

However, the above-described infrared sensor according to the related art has a problem in that a measurement temperature changes depending on a distance between the measurement object and the infrared sensor.

That is, referring to FIG. 2, as shown in (a) of FIG. 2, the temperature measured from the measurement object should not be changed regardless of a change in the measurement distance.

However, in general, a conventional infrared sensor has a phenomenon in which infrared rays radiated from an object are partially absorbed and reduced in the atmosphere as the distance increases, and the sensor becomes closer to or deviates from a measurable angle of view as the distance increases, so that the measurement temperature changes.

That is, as shown in (b) of FIG. 2, when an ambient temperature is lower than temperature of the measurement object, the temperature measured via the infrared sensor decreases as the distance increases, and as shown in (c) of FIG. 2, when the ambient temperature is higher than that of the measurement object, the measurement temperature increases as the distance increases.

As described above, the infrared sensor according to the related art has a problem in that accuracy for the measurement temperature of the measurement object is deteriorated according to the distance between the measurement object and the infrared sensor.

SUMMARY

According to an embodiment of the present invention, there is provided a sensor module capable of measuring a distance to a measurement object and compensating a measurement temperature with respect to the measurement object according to the measured distance, and a method for operating the same.

In addition, in an embodiment of the present invention, there is provided a sensor module capable of modularizing a temperature sensor for measuring a temperature and a distance sensor for measuring a distance into one, and a method for operating the same.

Technical problems to be solved by the embodiments proposed herein are not limited to those mentioned above, and other unmentioned technical aspects should be clearly understood by one of ordinary skill in the art to which the embodiments proposed herein pertain from the description below.

A sensor module according to an embodiment includes: a flexible circuit board; a temperature sensor disposed on the flexible circuit board to measure a temperature of a measurement object; a distance sensor disposed on the flexible circuit board to be adjacent to the temperature sensor and measuring a distance to the measurement object; a terminal cover disposed at upper portions of the temperature sensor and the distance sensor and including a first hole in which an upper surface of the temperature sensor is exposed and a second hole in which an upper surface of the distance sensor is exposed; and a window disposed at the second hole of the terminal cover.

In addition, an upper region of the temperature sensor is disposed in the first hole of the terminal cover and is exposed through an outside of the terminal cover.

Further, the sensor module further includes a decoration disposed to surround a periphery of an outer surface of the temperature sensor and dividing an upper region of the flexible circuit board into a region in which the temperature sensor is disposed and a region in which the distance sensor is disposed.

Furthermore, the decoration includes an upper decoration disposed on the flexible circuit board and surrounding a periphery of the temperature sensor, and a lower decoration disposed under the upper decoration and surrounding a lower region of the flexible circuit board on which the temperature sensor is disposed.

In addition, the decoration is disposed to be spaced apart from the outer surface of the temperature sensor at a predetermined distance, and an air gap is formed between an inner surface of the decoration and the outer surface of the temperature sensor.

Further, the window includes a first window disposed in the second hole of the terminal cover to cover the second hole, and a second window extended from the first window and disposed in the first hole of the terminal cover to surround at least the upper region of the temperature sensor.

Further, the sensor module further includes a decoration disposed to surround a periphery of the outer surfaces of the temperature sensor and the distance sensor, and dividing an upper region of the flexible circuit board into a region in which the temperature sensor and the distance sensor are disposed and the other region.

Furthermore, the decoration includes an upper decoration disposed on the flexible circuit board and surrounding a periphery of the temperature sensor and the distance sensor, and a lower decoration disposed under the upper decoration and surrounding the lower region of the flexible circuit board on which the temperature sensor and the distance sensor are disposed.

In addition, the upper decoration includes a first upper decoration disposed in the first hole of the terminal cover and surrounding the upper region of the temperature sensor, and a second upper decoration disposed in the second hole of the terminal cover and surrounding an upper region of the window.

In addition, the temperature sensor includes a heat dissipation substrate disposed on the flexible circuit board, a circuit pattern disposed on the heat dissipating substrate, a first element and a second element disposed on the heat dissipation substrate to be electrically connected to the circuit pattern and spaced apart from each other at a predetermined distance, a sensor cover disposed on the heat dissipation substrate to surround the circuit pattern, the first element and the second element, and having a hole formed in a region vertically overlapped with an upper surface of the first element, and a filter disposed in the hole of the sensor cover and transmitting a wavelength band of an infrared region from an outside to provide to the first element.

Further, at least one nitride resin of BN, AlN, $Al_2O_3$ and MgO is added to a ceramic resin in the heat dissipation substrate.

In addition, the distance sensor includes a light emitting part disposed on the flexible circuit board to generate light via the window, and a light receiving part disposed on the flexible circuit board to receive reflected light via the measurement object.

Further, the distance sensor is an auto-focusing device that measures a distance to the measurement object by using a phase difference between an output signal of the light emitting part and a received signal of the light receiving part, and adjusts a photographing focus of a camera by using the measured distance.

In addition, the sensor module further includes a control element electrically connected to the temperature sensor and the distance sensor via the flexible circuit board and compensating a measured temperature via the temperature sensor based on a distance to the measurement object measured via the distance sensor.

Meanwhile, a method for operating a sensor module according to an embodiment includes: storing a temperature compensation table; measuring a temperature of a measurement object using infrared rays emitted from the measurement object; measuring a distance to the measurement object; and compensating the measured temperature according to the measured distance by using the temperature compensation table.

In addition, the storing includes: changing a distance of an object having a specific temperature; confirming change information of the specific temperature according to the changed distance; determining a compensation coefficient of a temperature that varies according to the distance based on the confirmed change information; and generating a temperature compensation table based on the determined compensation coefficient.

Further, the measuring of the distance includes measuring a distance to the measurement object by an auto-focusing device which adjusts a photographing focus of a camera, and stopping an operation of the camera in order to measure the distance to the measurement object when the temperature is measured.

Meanwhile, a method for operating a sensor module according to an embodiment includes: inputting an operation command of a camera; and driving a composite module including an auto-focusing device and a temperature sensor in cooperation with the camera when the operation command of the camera is input.

In addition, the driving includes measuring a distance to an object to be photographed through the camera via the auto-focusing device, adjusting a photographing focus of the camera based on the measured distance, and measuring a temperature of the object to be photographed via the camera.

In addition, the method further includes compensating the measured temperature by using the distance to the object obtained for the photographing focus when the temperature is measured.

Further, the method further includes editing the photographed image based on the measured temperature of the object when a photographed image of the object is obtained, wherein the editing includes correcting at least one of color temperature, brightness, sharpness, and contrast of the photographed image.

Furthermore, the method further includes storing the measured temperature of the object as additional information of the photographed image when the photographed image of the object is obtained.

Advantageous Effects

According to an embodiment of the present invention, a change in measurement temperature according to a distance to an object may be compensated by using a laser detection auto focusing (LDAF) device generally provided in a portable terminal, and thus accuracy of a measurement temperature can be improved.

In addition, according to an embodiment of the present invention, a temperature sensor and a distance sensor may be modularized into a single composite module, so that an area and volume occupied by each sensor may be reduced, and thus a time and a cost required for manufacturing can be reduced.

Further, according to an embodiment of the present invention, a sense of unity of the composite module including the temperature sensor and the distance sensor may be improved by using a window of LDAF as a case of the composite module, and thus convenience of design for a user can be increased.

Further, according to an embodiment of the present invention, a sense of unity of the composite module including the temperature sensor and the distance sensor may be improved by using a decoration of the temperature sensor as a case of the composite module, and thus convenience of design can be increased.

Further, according to an embodiment of the present invention, influence of the temperature sensor on thermal noise generated inside the terminal may be minimized by increasing volume of the decoration of the temperature sensor to increase heat capacity, and thus measurement accuracy of the temperature sensor can be improved.

In addition, according to an embodiment of the present invention, the temperature sensor constituting the composite module may be operated together with an operation of a camera, so that it is possible to perform correction and editing of an image obtained via the camera by using the temperature sensor, and store temperature information obtained via the temperature sensor as additional information on the photographed image, and thus user satisfaction can be improved.

BRIEF DESCRIPTION OF DRAWINGS

FIG. 23 is a view illustrating additional information of a photographed image according to an embodiment of the present invention.

DETAILED DESCRIPTION OF THE INVENTION

Figure 1:
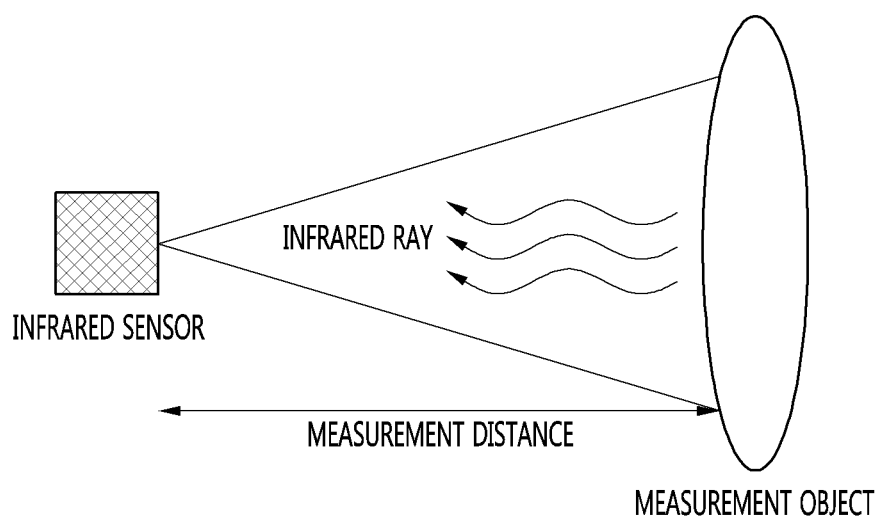
FIG. 1 is a view for explaining an operation of an infrared sensor according to the related art.
Figure 2:
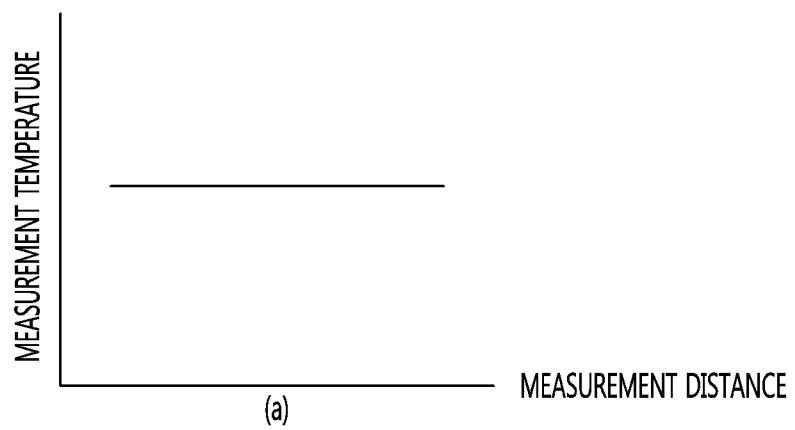
FIG. 2 is a view illustrating characteristics of measurement temperature according to the related art.
Figure 2:
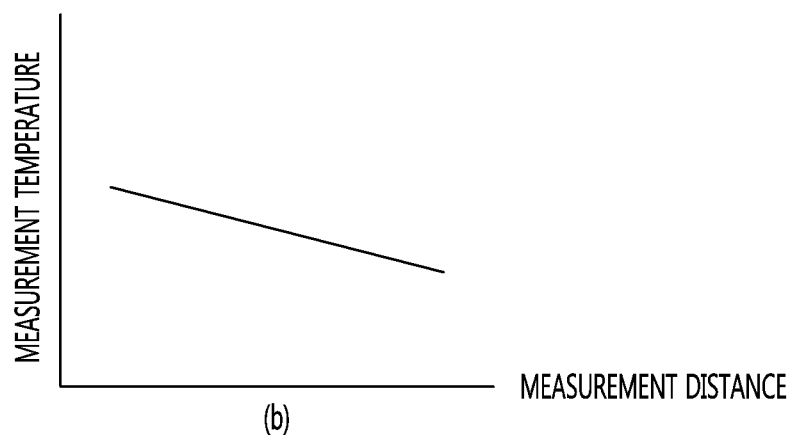
Figure 2:
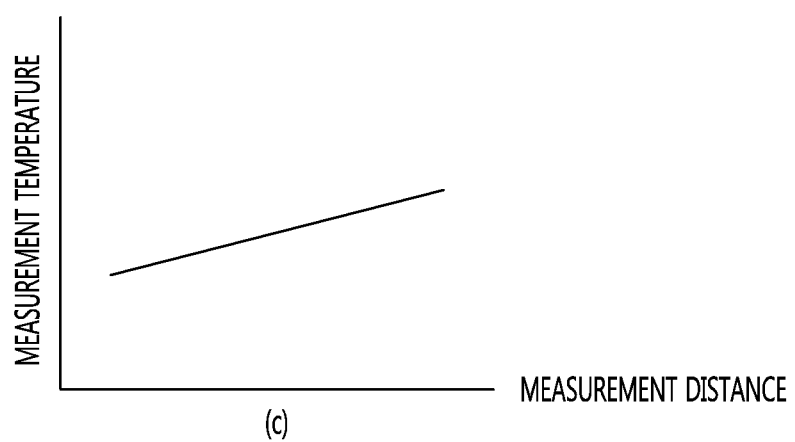

Hereinafter, exemplary embodiments of the present invention will be described in detail with reference to the accompanying drawings, wherein like reference numerals are used to designate identical or similar elements, and redundant description thereof will be omitted. The suffix "module" and "portion" of the components used in the following description are only given or mixed in consideration of ease of preparation of the description, and there is no meaning or role to be distinguished as it is from one another. Also, in the following description of the embodiments of the present invention, a detailed description of related arts will be omitted when it is determined that the gist of the embodiments disclosed herein may be obscured. Also, the accompanying drawings are included to provide a further understanding of the invention, are incorporated in, and constitute a part of this description, and it should be understood that the invention is intended to cover all modifications, equivalents, or alternatives falling within the spirit and scope of the invention.

Terms including ordinals, such as first, second, etc., may be used to describe various components, but the elements are not limited to these terms. The above terms are only used to distinguish one component from another.

When a component is referred to as being "connected" or "joined" to another component, it may be directly connected or joined to the other component, but it should be understood that other component may be present therebetween. When a component is referred to as being "directly connected" or "directly joined" to another component, it should be understood that other component may not be present therebetween.

A singular representation includes a plural representation, unless the context clearly indicates otherwise.

In the present application, terms such as "including" or "having" are used to specify the presence of features, numbers, steps, operations, components, parts, or combinations thereof described in the description. However, it should be understood that the terms do not preclude the presence or addition of one or more other features, numbers, steps, operations, components, parts, or combinations thereof.

The mobile terminal described in the present disclosure may include a mobile phone, a smart phone, a laptop computer, a digital broadcasting terminal, a personal digital assistant (PDA), a portable multimedia player (PMP), a navigation device, a slate PC, a tablet PC, an ultrabook, a wearable device, for example, a smartwatch, a smart glass, and a head mounted display (HMDs), etc.

However, it may be easily understood by a person skilled in the technical field that a configuration according to an embodiment described in the present disclosure may be applied to fixed terminals such as a digital TV, a desktop computer, and a digital signage, except when the present disclosure is applicable only to mobile terminals.

Figure 3:
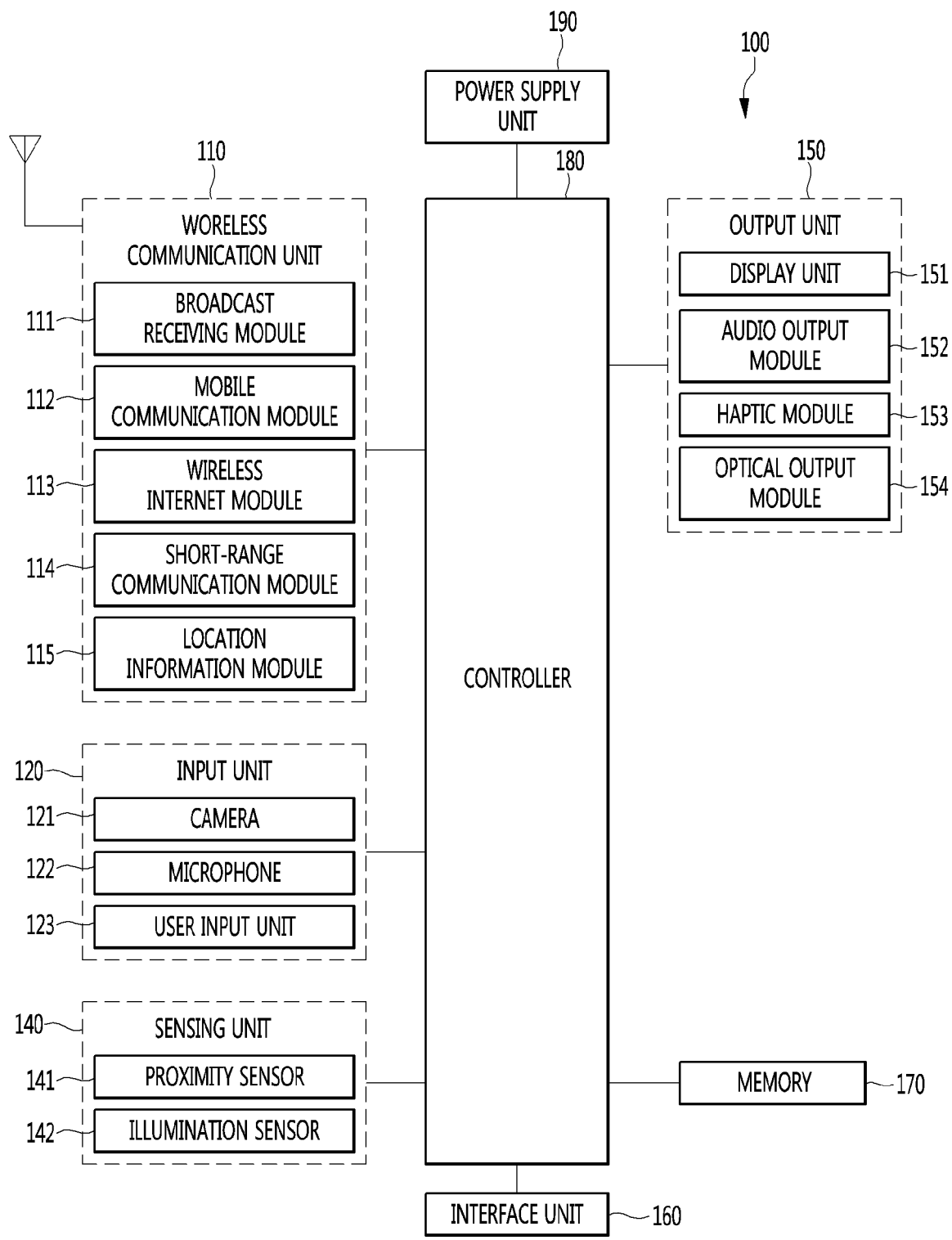
FIG. 3 is a block diagram for explaining a mobile terminal related to the present invention.
Figure 4:
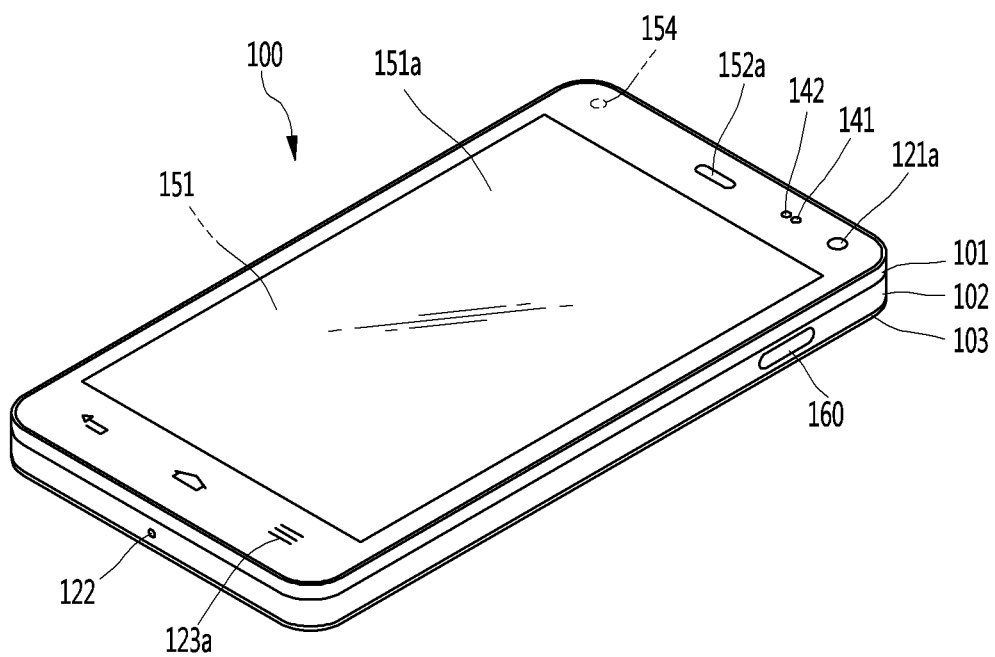
FIGS. 4 and 5 are conceptual diagrams illustrating an example of a mobile terminal related to the present invention viewed from different directions.
Figure 5:
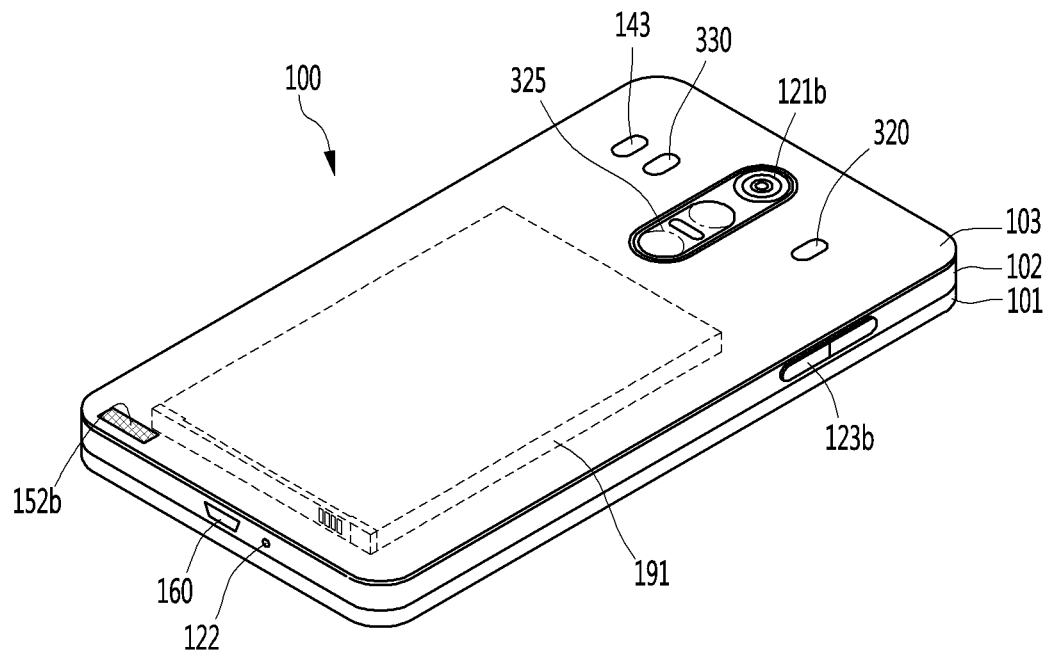

FIG. 3 is a block diagram for explaining a mobile terminal related to the present invention, and FIGS. 4 and 5 are conceptual diagrams illustrating an example of a mobile terminal related to the present invention from different directions.

Referring to FIGS. 3 to 5, the mobile terminal 100 may include a wireless communication unit 110, an input unit 120, a sensing unit 140, an output unit 150, an interface unit 160, a memory 170, a controller 180, and a power supply 190, and the like. The components shown in FIG. 3 are not necessarily essential for implementing a mobile terminal, and the mobile terminal described in the present disclosure may have more or fewer components than those listed above.

More specifically, the wireless communication unit 110 among the above-described components may include one or more modules that enable wireless communication between the mobile terminal 100 and a wireless communication system, between the mobile terminal 100 and another mobile terminal 100, or between the mobile terminal 100 and an external server. In addition, the wireless communication unit 110 may include one or more modules that connect the mobile terminal 100 to one or more networks.

The wireless communication unit 110 may include at least one of a broadcast receiving module 111, a mobile communication module 112, a wireless Internet module 113, a near field communication (NFC) module 114, and a global positioning system (GPS) module 115.

The input unit 120 may include a camera 121 or an image input part for inputting an image signal, a microphone 122 or an audio input part for inputting an audio signal, and a user input part 123 such as a touch key and a mechanical key for receiving information from a user. The audio data or image data collected from the input unit 120 may be analyzed and processed by a user's control command.

The sensing unit 140 may include one or more sensors for sensing at least one of information in the mobile terminal, surrounding environment information surrounding the mobile terminal, and user information. For example, the sensing unit 140 may include at least one of a proximity sensor 141, an illuminance sensor 142, a temperature sensor 143, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (e.g., see camera 121), a microphone (see microphone 122), a battery gauge, an environmental sensor (e.g., a barometer, a hygrometer, a radiation detection sensor, a thermal detection sensor, a gas detection sensor, etc.), and a chemical sensor (e.g., an electronic nose, a healthcare sensor, a biometric sensor, etc.). Meanwhile, the mobile terminal disclosed in the present disclosure may combine and use information sensed by at least two of the sensors.

The output unit 150 may include at least one of a display part 151, an acoustic output part 152, a haptic module 153, and an optical output part 154 for generating an output related to a visual sense, auditory sense, tactile sense or the like. The display part 151 may have a mutual layer structure with the touch sensor or may be integrally formed, so that a touch screen may be implemented. Such a touch screen may function as a user input part 123 that provides an input interface between the mobile terminal 100 and a user and simultaneously, may provide an output interface between the mobile terminal 100 and the user.

The interface unit 160 serves as a channel with various types of external devices connected to the mobile terminal 100. Such an interface unit 160 may include at least one of a wired/wireless headset port, an external charger port, a wired/wireless data port, a memory card port, a port for connecting a device equipped with an identification module, an audio input/output (I/O) port, a video input/output (I/O) port, and an earphone port. In the mobile terminal 100, corresponding to the connecting of an external device to the interface unit 160, it is possible to perform appropriate control related to the connected external device.

In addition, the memory 170 stores data supporting various functions of the mobile terminal 100. The memory 170 may store a plurality of application programs or applications that are run in the mobile terminal 100, data for operation of the mobile terminal 100, and commands. At least some of such application programs may be downloaded from an external server via wireless communication. Further, at least some of such application programs may be present on the mobile terminal 100 from the time of shipment for basic functions (e.g., call incoming and outgoing functions, or message receiving and sending functions) of the mobile terminal 100. Meanwhile, the application program may be stored in the memory 170, and installed on the mobile terminal 100 so as to run to perform the operation (or function) of the mobile terminal by the controller 180.

The controller 180 generally controls the overall operation of the mobile terminal 100 in addition to the operation related to the application program. The controller 180 may process signals, data, information, and the like, which are input or output via the above-described components, or may run an application program stored in the memory 170, thereby providing or processing appropriate information or functions to a user.

Furthermore, the controller 180 may control at least some of the components reviewed together with FIG. 3 to run an application program stored in the memory 170. In addition, the controller 180 may combine and operate at least two of the components included in the mobile terminal 100 to run the application program.

Further, the controller 180 corrects temperature information obtained via the temperature sensor 143 by using distance information obtained from an auto-focusing device (to be described later) necessary for an operation of the camera 121. For this, a compensation table for compensating measurement temperature according to a distance to a measurement object is stored in the memory 170.

For this, the controller 180 allows a temperature of an object having a specific temperature to be measured via the temperature sensor while changing a distance of the object having the specific temperature, confirms change information of the measured temperature according to the changed distance, and determines a compensation coefficient of the temperature that changes depending on the distance based on the confirmed change information.

Furthermore, when the compensation coefficient is determined, the controller 180 creates a temperature compensation table for temperature compensation according to the distance based on the determined compensation coefficient, and stores the created table in the memory 170.

In addition, the controller 180 allows a function of either the camera function or the temperature sensor function to be performed by the auto-focusing device to be described later.

That is, the auto-focusing device performs a function of automatically adjusting a focus for photographing by a camera and a function of measuring a distance to a temperature measurement object.

Accordingly, when the temperature is measured by the temperature sensor, the controller 180 uses the auto-focusing device as a distance sensor to measure the distance to the measurement object, and thus an operation of the camera is stopped so as to solve a problem caused by an out of focus.

Meanwhile, the controller 180 may operate a composite module 400 in cooperation with the operation of the camera 121. In other words, the controller 180 may operate the auto-focusing device 330 and the temperature sensor 143 constituting the composite module 400 in cooperation with the operation of the camera 121.

For example, the controller 180 operates the auto-focusing device 330 at the time when the camera 121 operates. The auto-focusing device 330 measures a distance between the camera 121 and an object to be photographed by the camera 121, and the controller 180 adjusts a photographing focus for the operation of the camera 121 according to the measured distance.

Accordingly, the camera 121 may obtain a photographed image with accurate focus.

At this time, the controller 180 uses the distance information used for the operation of the camera 121, that is, the information of the auto-focusing device 330 to focus the auto-focusing at the time of operating the camera 121 and controls the operation of the temperature sensor 143.

In other words, at the time when the camera 121 operates, a temperature measurement of the temperature sensor 143 with respect to the object to be photographed by the camera 121 is performed. At this point, a composite module 400 including the camera 121, the temperature sensor 143, and the auto-focusing device 330 is disposed in a line on the mobile terminal. Accordingly, the object to be photographed by the camera 121, the object to be distance-measured by the auto-focusing device 330, and the object to be temperature-measured by the temperature sensor 143 may all be the same object.

Accordingly, the controller 180 may drive the composite module 400 together with the operation of the camera 121, so that detailed information on the object to be photographed may be obtained by the camera 121.

In addition, the controller 180 edits the image photographed by the camera 121 based on the measurement temperature of the temperature sensor 143, which is operated in cooperation with the camera 121.

That is, the camera 121 may obtain different images depending on a state of the object to be photographed. In other words, when the temperature of the object is high, the camera 121 can obtain an image having a high color temperature, and when the temperature of the object is low, the camera 121 may obtain an image having a low color temperature.

Therefore, the controller 180 determines a correction condition of the image photographed by the camera 121 according to a result value of the composite module 400, which is operated in cooperation with the camera 121. The correction condition may include a color temperature of the image, and may further include contrast, brightness, sharpness and the like of the image.

For example, when the temperature of the photographed object is high, the controller 180 may edit the photographed image via the camera 121 to have a warm color temperature, and when the temperature of the photographed object is low, the controller 180 may edit the photographed image via the camera 121 to have a cold color temperature. At this point, the correction condition information of the photographed image according to the temperature of the object to be photographed via the camera 121 may be stored in the memory. Further, the controller 180 corrects and edits the photographed image via the camera 121 according to the obtained temperature of the object by using the stored correction condition information.

Meanwhile, when an image is photographed via the camera 121, additional information on the photographed image is stored in the memory.

The additional information may include title, photographing date/time, media type, resolution, photographing direction, file size, manufacturer, model name, flash status, focal length, white balance status, aperture status, exposure time, ISO information, file path information and the like.

At this point, the controller 180 may include the temperature information measured via the temperature sensor 143 of the composite module 400, which is operated in cooperation with the camera 121, in the additional information of the photographed image so as to store in the memory.

Furthermore, the controller 180 sets a temperature measurement condition of the temperature sensor 143 by using the photographed image via the camera 121 when the operation of the temperature sensor 143 is performed in cooperation with the operation of the camera 121.

In other words, when the photographed image is obtained via the camera 121, the controller 180 analyzes the obtained image and confirms a state of the object included in the photographed image.

At this point, the state of the object includes distance information between the mobile terminal and the object, and size information of the object. Here, the distance information may use information obtained from the auto-focusing device.

In addition, in general, the temperature sensor 143 receives the infrared rays radiated from the object while having a predetermined angle of view, and performs temperature measurement, and when the size of the object is out of range of an angle of view according to the distance, it is difficult to measure normal temperature.

Accordingly, when the distance and size information of the object is obtained, the controller 180 sets a temperature measurement condition capable of performing an optimal temperature measurement via the temperature sensor 143 by using the obtained distance and size information. Here, the temperature measurement condition may include a distance condition between the temperature sensor 143 and the object according to the size of the object.

When the temperature measurement condition is set, the controller 180 displays information on the set temperature measurement condition.

In other words, when the temperature of the object is measured in cooperation with the camera 121, the controller 180 informs whether the object is within or out of the viewing angle of the temperature sensor 143 according to the size and distance of the object.

Further, when the object is not coming in the angle of view of the temperature sensor 143 because the distance to the object is too far away, the controller 180 may output command information for performing temperature measurement at a position closer to the object.

The power supply 190 receives external power and internal power under a control of the controller 180 and supplies power to the components included in the mobile terminal 100. The power supply 190 may include a battery, which may be an internal battery or a replaceable battery.

At least some of each of the components may operate in cooperation with each other to implement an operation, a control, or a control method of the mobile terminal according to various embodiments described below. Furthermore, the operation, control, or control method of the mobile terminal may be implemented on the mobile terminal by driving at least one application program stored in the memory 170.

Referring to FIGS. 4 and 5, the disclosed mobile terminal 100 is provided with a bar-shaped terminal body. However, the present invention is not limited thereto, and may be applied to various structures such as a watch type, a clip type, a glass type, or a folder type, a flip type, a slide type, a swing type, and a swivel type in which two or more bodies are relatively movably coupled. Although the present invention is relevant to a specific type of mobile terminal, a description of a specific type of mobile terminal is generally applicable to other types of mobile terminals.

Here, the terminal body may be understood as a concept of referring to the mobile terminal 100 as at least one aggregate.

The mobile terminal 100 includes a case (e.g., a frame, a housing, a cover, etc.) which forms an appearance. As shown, the mobile terminal 100 may include a front case 101 and a rear case 102. Various electronic components are disposed in an inner space formed by combining the front case 101 and the rear case 102. At least one middle case may be additionally disposed between the front case 101 and the rear case 102.

A display part 151 is disposed at a front surface of the terminal body to output information. As shown, a window 151a of the display part 151 may be mounted on the front case 101 to form the front surface of the terminal body together with the front case 101.

In some cases, electronic components may be mounted also on the rear case 102. The electronic components capable of being mounted on the rear case 102 include a detachable battery, an identification module, a memory card, and the like. In this case, a rear cover 103 for covering the mounted electronic components may be detachably coupled to the rear case 102. Therefore, when the rear cover 103 is separated from the rear case 102, the electronic components mounted on the rear case 102 are exposed to an outside.

As shown, when the rear cover 103 is coupled to the rear case 102, a part of a side surface of the rear case 102 may be exposed. In some cases, the rear case 102 may be completely covered by the rear cover 103 during the coupling. Meanwhile, the rear cover 103 may be provided with an opening for exposing a second camera 121b or a second acoustic output part 152b to the outside.

Such cases 101, 102 and 103 may be formed by injection molding of synthetic resin or may be formed of a metal such as stainless steel (STS), aluminum (Al), titanium (Ti) or the like.

The mobile terminal 100 may be configured such that one case provides an internal space, unlike the above example in which a plurality of cases provide an internal space for accommodating various electronic components. In this case, a unibody mobile terminal 100 in which a synthetic resin or a metal is connected from a side surface to a rear surface may be implemented.

Meanwhile, the mobile terminal 100 may be provided with a waterproof part (not shown) for preventing water from penetrating into the terminal body. For example, the waterproof part is provided between the window 151a and the front case 101, between the front case 101 and the rear case 102, or between the rear case 102 and the rear cover 103 to include a waterproof member for sealing inside spaces thereof.

The mobile terminal 100 may be provided with a display part 151, first and second acoustic output parts 152a and 152b, a proximity sensor 141, an illuminance sensor 142, a temperature sensor 143, an optical output part 154, first and second cameras 121a and 121b, first and second operation parts 123a and 123b, a microphone 122, an interface unit 160, and the like.

Hereinafter, as shown in FIGS. 4 and 5, the mobile terminal 100 will be described as an example, in which a display part 151, a first acoustic output part 152a, a proximity sensor 141, an illuminance sensor 142, an optical output part 154, a first camera 121a, and a first operation part 123a are disposed at the front surface of the terminal body, a second operation part 123b, a microphone 122, and an interface unit 160 are disposed at a side surface of the terminal body, and a second acoustic output part 152b and a second camera 121b are disposed at a rear surface of the terminal body.

However, these configurations are not limited to such an arrangement. These configurations may be omitted or replaced as necessary, or disposed at different surfaces. For example, the first operation part 123a may not be provided at the front surface of the terminal body, and the second acoustic output part 152b may be provided at the side surface of the terminal body rather than the rear surface of the terminal body.

The display part 151 displays (outputs) the information processed by the mobile terminal 100. For example, the display part 151 may display execution screen information of an application program run by the mobile terminal 100 or UI (User Interface) and GUI (Graphic User Interface) information according to such execution screen information.

The display part 151 may include at least one of a liquid crystal display (LCD), a thin film transistor-liquid crystal display (TFT LCD), an organic light-emitting diode (OLED) display, a flexible display, a 3D display, and an e-ink display.

In addition, the display part 151 may be present in two or more depending on an embodiment of the mobile terminal 100. In this case, the mobile terminal 100 may be provided with a plurality of display parts that are disposed to be spaced apart from each other or integrally disposed with each other, and may be disposed at different surfaces, respectively.

The display part 151 may include a touch sensor that senses a touch to the display part 151 so that a control command may be input by a touch method. Using this, when a touch is made to the display part 151, the touch sensor may sense the touch, and the controller 180 may be configured to generate a control command corresponding to the touch based on the touch. The content input by the touch method may be a text or a number, a command in various modes, assignable menu items or the like.

Meanwhile, the touch sensor may be configured to be in a film shape having a touch pattern and disposed between the window 151a and a display (not shown) on a rear surface of the window 151a or may be a metal wire directly patterned on the rear surface of the window 151a. Alternatively, the touch sensor may be formed integrally with the display. For example, the touch sensor may be disposed on a substrate of the display or in the display.

As described above, the display part 151 may form a touch screen together with the touch sensor. In this case, the touch screen may function as the user input part 123 (see FIG. 3). In some cases, the touch screen may replace at least some of the functions of the first operation part 123a.

The first acoustic output part 152a may be implemented as a receiver for transmitting a call sound to a user's ear, and the second acoustic output part 152b may be implemented in a form of a loud speaker for outputting various alarm sounds or multimedia playback sounds.

The window 151a of the display part 151 may be provided with an acoustic hole for emitting a sound generated from the first acoustic output part 152a. However, the present invention is not limited thereto, and the sound may be configured to be emitted along an assembly gap (for example, a gap between the window 151a and the front case 101) between the structures. In this case, appearance of the mobile terminal 100 may be made simpler because in terms of appearance, the holes independently formed for acoustic output are invisible or hidden.

The optical output part 154 is configured to output light for notifying the occurrence of an event when the event occurs. Examples of the event include a message reception, a call signal reception, a missed call, an alarm, a schedule notification, an e-mail reception, reception of information via an application, and the like. The controller 180 may control the optical output part 154 to terminate the light output when the event confirmation of the user is detected.

The first camera 121a processes an image frame of a still image or a moving image obtained by an image sensor in a photographing mode or a video call mode. The processed image frame may be displayed at the display part 151 and may be stored in the memory 170.

The first and second operation parts 123a and 123b may be collectively referred to as a manipulating portion as an example of the user input part 123 operated to input a command for controlling the operation of the mobile terminal 100. The first and second operation parts 123a and 123b may be employed in any manner, such as touch, push, and scroll, when the user's operation is in a tactile manner. In addition, the first and second operation parts 123a and 123b may be employed in a manner that the user does not feel a tactile feel via a proximity touch, hovering touch, etc., when the user operates.

In the present figures, the first operation part 123a is a touch key, but the present invention is not limited thereto. For example, the first operation part 123a may be a push key (mechanical key), or a combination of a touch key and a push key.

The contents input by the first and second operation parts 123a and 123b may be variously set. For example, the first operation part 123a may be input with a command such as a menu, a home key, a cancellation, a search, and the like, and the second operation part 123b may be input with a command of adjusting a size of sound output from the first or second acoustic output parts 152a or 152b, switching to a touch recognition mode of the display part 151, or the like.

Meanwhile, a rear input part (not shown) may be provided at the rear surface of the terminal body as another example of the user input part 123.

The rear input part is operated to input a command for controlling the operation of the mobile terminal 100, and input contents may be variously set. For example, commands such as power on/off, start, end, scrolling, and the like, the adjusting of the size of the sound output from the first and second acoustic output parts 152a and 152b, the switching to the touch recognition mode of the display part 151, and the like may be input. The rear input part may be implemented in a form capable of inputting by a touch input, a push input, or a combination thereof.

The rear input part may be disposed to be overlapped with the display part 151 of a front surface in a thickness direction of the terminal body. For example, the rear input part may be disposed at a rear upper end of the terminal body so that the user may easily manipulate the terminal body with an index finger when the user holds the terminal body with one hand. However, the present invention is not limited thereto, and a position of the rear input part may be changed.

When a rear input part is provided at the rear surface of the terminal body, a new type of user interface using the rear input part may be implemented. In addition, when the above-described touch screen or rear input part replaces at least some functions of the first operation part 123a provided at the front surface of the terminal body and the first operation part 123a is not disposed at the front surface of the terminal body, the display part 151 may be configured as a large screen compared to the conventional one.

Meanwhile, the mobile terminal 100 may be provided with a fingerprint recognition sensor for recognizing a fingerprint of the user, and the controller 180 may use the sensed fingerprint information via the fingerprint recognition sensor as authentication means. The fingerprint recognition sensor may be embedded in the display part 151 or the user input part 123.

The microphone 122 is configured to input the user's voice, other sounds, and the like. The microphone 122 may be configured to be provided at a plurality of locations to input stereophonic sound.

The interface unit 160 becomes a path through which the mobile terminal 100 may be connected to an external device. For example, the interface unit 160 may be at least one of a connection terminal for connecting with other devices (e.g., earphone or external speaker), a port for near field communication (e.g., an infrared port (IrDA port), a Bluetooth port, a wireless LAN port, or the like), or a power supply terminal for supplying power to the mobile terminal 100. Such an interface unit 160 may be implemented in a socket form for accommodating an external card such as a subscriber identification module (SIM) or a user identity module (UIM), a memory card for storing information or the like.

The second camera 121b may be disposed at the rear surface of the terminal body. In this case, the second camera 121b has a photographing direction substantially opposite to that of the first camera 121a.

The second camera 121b may include a plurality of lenses arranged along at least one line. The plurality of lenses may be arranged in a matrix form. Such a camera may be called as an array camera. When the second camera 121b is configured as an array camera, images may be photographed in various ways by using the plurality of lenses, and an image with better quality may be obtained.

A flash 124 may be disposed to be adjacent to the second camera 121b. The flash 124 emits light toward a subject when the subject is photographed by the second camera 121b.

The second acoustic output part 152b may be additionally disposed at the terminal body. The second acoustic output part 152b may implement a stereo function together with the first acoustic output part 152a and may be used for implementing a speakerphone mode at the time of calling.

The terminal body may be provided with at least one antenna for wireless communication. The antenna may be embedded in the terminal body or formed at the case. For example, an antenna constituting a part of the broadcast receiving module 111 (see FIG. 3) may be configured to be withdrawable from the terminal body. Alternatively, the antenna may be formed in a film type and attached to the inner side surface of the rear cover 103, or a case including a conductive material may be configured to function as an antenna.

The terminal body is provided with the power supply 190 (see FIG. 3) for supplying power to the mobile terminal 100. The power supply 190 may include a battery 191 built in the terminal body or detachably configured at the outside of the terminal body.

The battery 191 may be configured to receive power via a power cable connected to the interface unit 160. In addition, the battery 191 may be configured to be wirelessly chargeable via a wireless charger. The wireless charging may be implemented by a magnetic induction method or a resonance method (magnetic resonance method).

Meanwhile, in the drawings, the rear cover 103 is coupled to the rear case 102 so as to cover the battery 191 to restrict release of the battery 191 and to protect the battery 191 from external impacts and foreign substances. When the battery 191 is configured to be detachable from the terminal body, the rear cover 103 may be detachably coupled to the rear case 102.

The mobile terminal 100 may be provided with an accessory that protects appearance or supplements or expands a function of the mobile terminal 100. One example of such an accessory is a cover or pouch that covers or accommodates at least one side of the mobile terminal 100. The cover or pouch may be configured to cooperate with the display part 151 to expand the function of the mobile terminal 100. Another example of an accessory is a touch pen for supplementing or extending a touch input to the touch screen.

Figure 6:
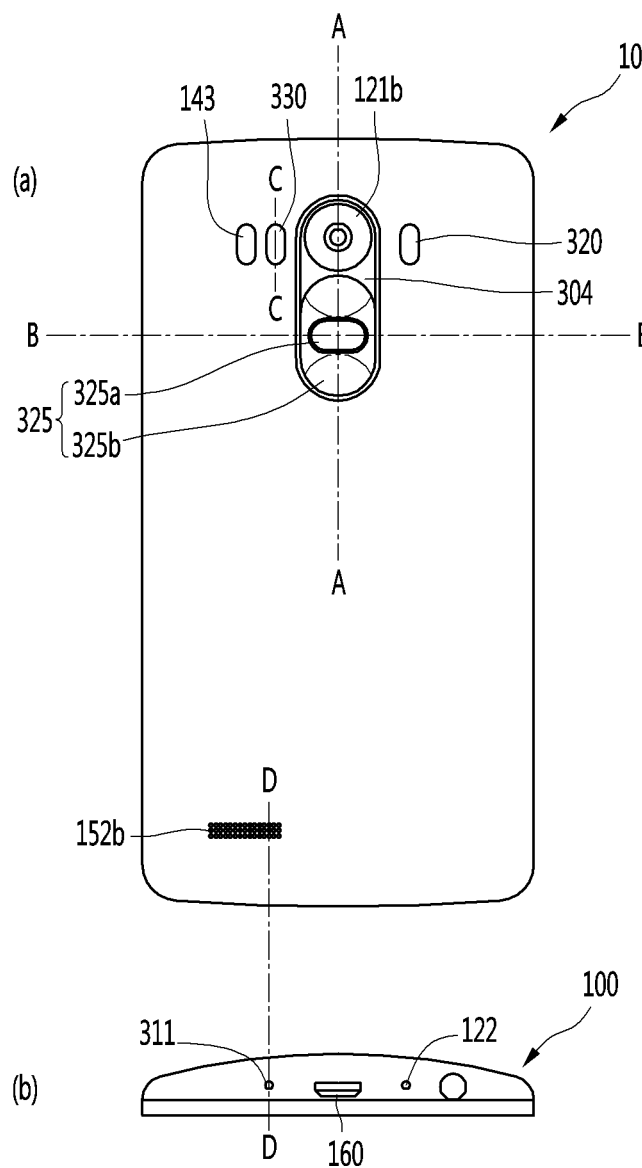
FIG. 6 is a rear view and a bottom view of a mobile terminal 100 related to an embodiment of the present invention.

FIG. 6 is a rear view and a bottom view of a mobile terminal 100 related to an embodiment of the present invention, which illustrates that a user input part 325 is provided at an upper side of a rear surface of the mobile terminal 100, a laser detection auto focusing (LDAF) device 330 is disposed at one side of the user input part 325, a temperature sensor 143 is disposed at one side of the auto-focusing device 330, and a flash unit 320 is disposed at the other side of the user input part 325. At this point, the user input part 325 may include a first button portion 325a exposed to a rear surface of the body of the mobile terminal and configured to perform a first function and a second button portion 325b disposed to be adjacent to the first button portion 325a and configured to perform a second function.

In addition, a second acoustic output part 152b is formed under the mobile terminal 100.

The first function may be a function related to power on/off or the activation of the display part and the second function may be a function related to the adjusting of the size of sound output from the body of the terminal or a function for scrolling output information of the display part. Accordingly, the second button portion 325b may be disposed to be divided into upper and lower portions or left and right portions and the first button portion 325a may be disposed between or within the second button portion 325b.

The mobile terminal 100 includes a first button portion 325a exposed from the rear surface to the outside and receiving a push input of a first function and a second button portion 325b having keys disposed on both sides of the first button portion 325a and receiving a push input of a second function different from the first function.

The first button portion 325a is formed to pass through the second button portion 325b between the keys. That is, a through hole (not shown) may be formed at the second button portion 325b, the keys may be configured to be a protruding surface as a surface exposed to the outside, and the opposite surface of the protruding surface may be formed in a plane. Through this, the user may recognize which key is touched by touch.

In the above-description, the case in which the user input part 325 is configured with a plurality of buttons has been described, but the present invention is not limited thereto. For example, the user input part 325 may include a single button. In addition, in the following description, a case in which the user input part 325 has a plurality of buttons is illustrated, but a function defined by an input to any one of the plurality of buttons may be applied to the single button.

In FIG. 6, the second camera 121b and the user input part 325 are formed as a module by a support member 304, but the present invention is not limited thereto, and the user input part 325 and the second camera 121b may be formed independently with each other.

Figure 7:
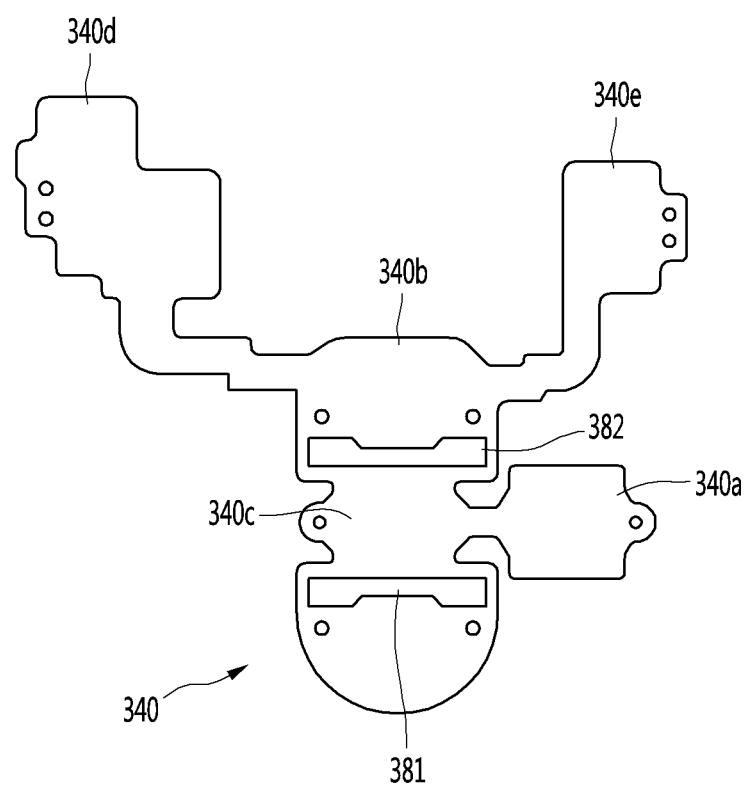
FIGS. 7 and 8 are a top view and a perspective view of a flexible circuit board related to an embodiment of the present invention.
Figure 8:
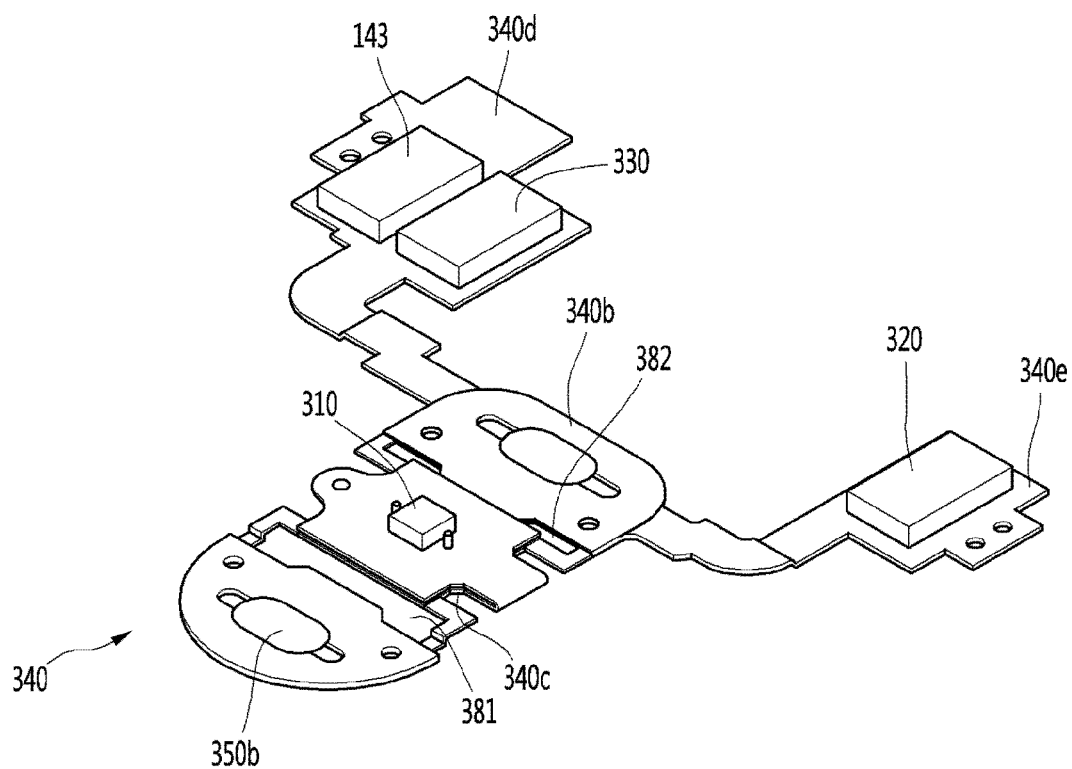

FIGS. 7 and 8 are a top view and a perspective view of a flexible circuit board related to an embodiment of the present invention.

The mobile terminal 100 according to an embodiment of the present invention further includes a flexible circuit board 340 disposed at lower portions of the first button portion 325a and the second button portion 325b and connected to a printed circuit board 344 and a human body sensor 310 disposed under the first button portion 325a. The human body sensor 310 may be any one of an RGB sensor, a heart rate sensor, and a fingerprint recognition sensor. The human body sensor 310 is disposed in the first button portion 325a or disposed under the first button portion 325a. The first button portion 325a may be formed in a dome shape.

Meanwhile, in the embodiment of the present invention, since the human body sensor 310 and the first button portion 325a are formed to be overlapped with each other, an arrangement of switches for operating the human body sensor 310 and the first button portion 325a may be a problem. That is, when the first button portion 325a is pressed, the human body sensor 310 should not be pressed. For this, in an embodiment of the present invention, the flexible circuit board 340 includes a sensor forming portion 340a in which the human body sensor 310 is formed and switch forming portions 340b and 340c connected to the sensor forming portion 340a, at least a part of which is spaced to be overlapped with the sensor forming portion 340a and in which a switch 350b for operating the first and second button portions 325a and 325b is formed on one side.

The human body sensor 310 is disposed at an upper surface of the sensor forming portion 340a, and a first switch for operating the first button portion 325a may be formed particularly in a first switch forming portion 340c among the switch forming portions 340b and 340c spaced apart from the sensor forming portion 340a, so that positions of forming a portion of the flexible circuit board 340 for operating the human body sensor 310 and that of the flexible circuit board 340 for operating the first button portion 325a are different.

Meanwhile, since the flexible circuit board 340 is flexible, the rigidity is weak so that the rigidity needs to be supplemented. For this, a stiffener may be disposed at one surface of the flexible circuit board 340 in one embodiment of the present invention.

Meanwhile, FIG. 7 illustrates a state before the sensor forming portion 340a is bent, and FIG. 8 illustrates a state after the sensor forming portion 340a is bent. As shown in FIGS. 7 and 8, in one embodiment of the present invention, slits 381 and 382 may be formed at both sides of the first switch forming portion 340c, so that influence of the first and second switch forming portions 340c and 340d on each other may be minimized. That is, the first and second switch forming portions 340c and 340d may be divided by the slits 381 and 382.

That is, the flexible circuit board 340 has a first switch forming portion 340c and a second switch forming portion 340b corresponding to the first button portion 325a and the second button portion 325b, respectively, and the first switch forming portion 340c and the second switch forming portion 340b may be simultaneously pressed when the first button portion 325a or the second button portion 325b is pressed by the user. In an embodiment of the present invention, the dividing slits 381 and 382 are formed at the flexible circuit board 340 to prevent this.

That is, as shown in FIGS. 7 and 8, the dividing slits 381 and 382 are formed at both sides of the first switch forming portion 340c so as to divide the first switch forming portion 340c and the second switch forming portion 340b.

As described above, in an embodiment of the present invention, the sensor forming portion 340a and the first switch forming portion 340c are spaced apart from each other at a predetermined distance. For this, in one embodiment of the present invention, as shown in FIGS. 7 and 8, the sensor forming portion 340a extends from the first switch forming portion 340c of the switch forming portions 340b and 340c to be bent. As described above, in an embodiment of the present invention, the human body sensor 310 and the first switch may be formed at outer surfaces of the sensor forming portion 340a and the first switch forming portion 340c to be bent.

The sensor forming portion 340a may be bent in this manner, so that an arrangement space for a reinforcing member of the flexible circuit board may be secured and the human body sensor 310 may be formed in the first button portion 325a while the human body sensor 310 is disposed under the first button portion 325a.

Reviewing FIG. 7 in detail, it can be seen that the flexible circuit board 340 is formed of a sensor forming portion 340a, a first switch forming portion 340c formed by extending from the sensor forming portion 340a, a second switch forming portion 340b formed at both sides of the first switch forming portion 340c, a flash forming portion 340e formed respectively at both sides from the second switch forming portion 340b, and a temperature sensor forming portion 340d.

At this point, an auto-focusing device arrangement space in which the auto-focusing device 330 may be disposed and a temperature sensor arrangement space in which the temperature sensor may be disposed may be divided on the temperature sensor forming portion 340d. However, in an embodiment of the present invention, since the temperature sensor and the auto-focusing device are configured in one module, a composite module in which the temperature sensor 143 and the auto-focusing device 330 are modularized into one is disposed on the temperature sensor forming portion 340d.

Reviewing FIG. 8, it can be seen that the human body sensor 310 is disposed at the sensor forming portion 340a, a second switch 350b is formed at the second switch forming portion 340b, a flash unit 320 is formed at the flash forming portion 340e, a composite module 400 in which the auto-focusing device 330 and the temperature sensor 143 are modularized into one is formed at the temperature sensor forming portion 340d.

Meanwhile, in an embodiment of the present invention, the first button portion 325a is made of a light transmitting material. In particular, since a sensor using a property of transmitting light such as an RGB sensor may be provided under the first button portion 325a, in an embodiment of the present invention, the first button portion 325a may be preferably made of a material that transmits light. However, since it is sufficient to transmit light only, it is not necessary to be a completely transparent material like glass, and it may be a semi-transparent material. For example, the first button portion 325a may be glass or a transparent resin (for example, polycarbonate).

In this case, the RGB sensor in an embodiment of the present invention is a sensor used for the purpose of improving image quality of the camera by performing a function of controlling a white balance. That is, the RGB band of a light source received by the RGB sensor is analyzed to correct the white balance, and accordingly, color temperature is analyzed to correct the white balance. When the human body sensor 310 is an RGB sensor, it is preferable that an inner surface of the first button portion 325a is formed to have a predetermined curvature.

As described above, according to an embodiment of the present invention, a space is provided in which a composite module in which the auto-focusing device 330 and the temperature sensor 143 are modularized into one may be disposed at a part of the flexible circuit board 340 at which the flash unit is provided, and the composite module is disposed on the provided space.

Hereinafter, a composite module in which the auto-focusing device 330 and the temperature sensor 143 are modularized into one will be described in more detail.

Figure 9:
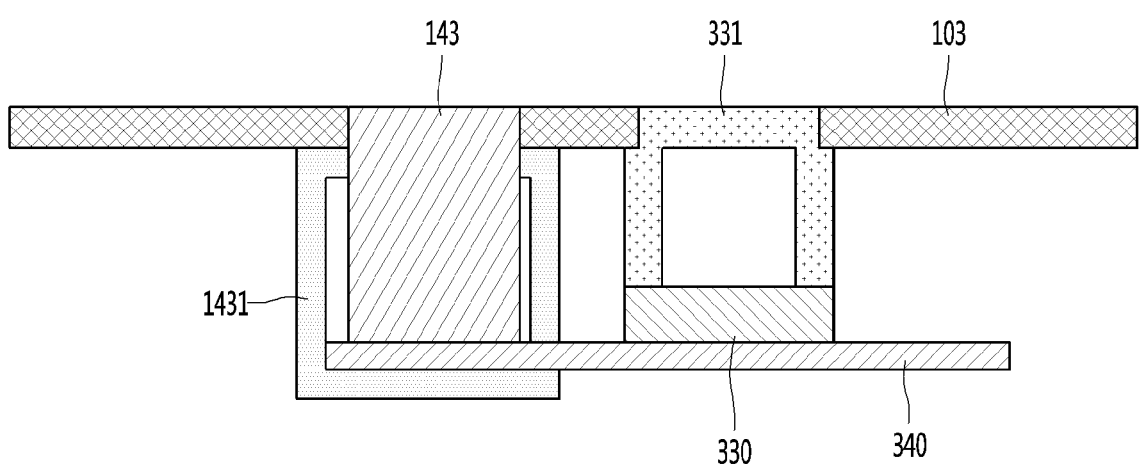
FIG. 9 is a cross-sectional view illustrating a configuration of a composite module 400 according to an embodiment of the present invention.

FIG. 9 is a cross-sectional view illustrating a configuration of a composite module 400 according to an embodiment of the present invention.

Referring to FIG. 9, a temperature sensor 143 and an auto-focusing device 330 are disposed on the flexible circuit board 340 at a predetermined interval.

In addition, an upper portion of the temperature sensor 143 is exposed to the outside through a hole formed in the rear cover 103 of the terminal 100. More preferably, the temperature sensor 143 may have a hole formed on an upper surface thereof, and a filter (to be described later) may be disposed at the formed hole. The filter may be a spherical silicon lens.

That is, the rear cover 103 of the terminal 100 exposes a silicon optical portion of the temperature sensor 143 to the outside.

A separate window 331 for the auto-focusing device 330 is provided on the auto-focusing device 330. The window 331 is formed of a light-transmitting material that transmits light from the outside while protecting an inside of the auto-focusing device 330.

Further, a decoration 1431 is disposed to surround the temperature sensor 143. The decoration 1431 surrounds the temperature sensor 143 and divides the temperature sensor forming portion 340d of the flexible circuit board 340 into a plurality of regions.

That is, the decoration 1431 is disposed to surround the temperature sensor 143 so that the temperature sensor forming portion 340d of the flexible circuit board 340 is divided into a region in which the temperature sensor 143 is disposed and a region in which the auto-focusing device 330 is disposed.

In other words, the temperature sensor 143 is vulnerable to heat, and thus heat generated from the auto-focusing device 330 may affect temperature measurement environment of the temperature sensor 143. Therefore, the decoration 1431 divides an arrangement region of the temperature sensor 143 and that of the auto-focusing device 330 while protecting the temperature sensor 143, so that the heat generated from the auto-focusing device 330 does not affect operational environment of the temperature sensor 143.

Meanwhile, a lower portion of the decoration 1431 does not surround only the temperature sensor 143 but surrounds a lower surface of the flexible circuit board 340 overlapping with the region in which the temperature sensor 143 is disposed together with the temperature sensor 143.

Therefore, the heat introduced via the lower surface of the flexible circuit board 340 may be blocked, and thus operational reliability of the temperature sensor 143 can be further improved.

Meanwhile, the decoration 1431 is not in direct contact with an outer surface of the temperature sensor 143 but is spaced apart from the outer surface of the temperature sensor 143 at a predetermined distance. Therefore, an air gap is formed between the decoration 1431 and the temperature sensor 143. The air gap may block heat or noise introduced from the outside, and thus operational reliability of the temperature sensor 143 can be further improved.

At this point, the decoration 1431 may be disposed on the flexible circuit board 340, and may have a structure including an upper decoration surrounding a periphery of the temperature sensor and a lower decoration surrounding a lower region of the flexible circuit board.

As described above, in a first embodiment of the present invention, the temperature sensor 143 and the auto-focusing device 330 are disposed together on the flexible circuit board 340. In addition, holes exposing upper regions of the temperature sensor 143 and the auto-focusing device 330 disposed on the flexible circuit board 340 are formed at the rear cover 103 of the terminal corresponding to a mounting structure.

The hole includes a first hole in which the upper region of the temperature sensor 143 is exposed and a second hole in which the upper region of the auto-focusing device 330 is exposed.

Further, the upper surface of the temperature sensor 143 is directly exposed at the first hole and the window 331 of the auto-focusing device 330 is disposed at the second hole.

Furthermore, the decoration 1431 spaced apart from the outer surface of the temperature sensor 143 at a predetermined distance is disposed at a periphery of the temperature sensor 143, and the decoration 1431 divides an upper region of the flexible circuit board 340 into a region in which the temperature sensor 143 is disposed and a region in which the auto-focusing device 330 is disposed.

In addition, the decoration 1431 surrounds a part of the flexible circuit board 340 on which the temperature sensor 143 is disposed together with the temperature sensor 143, so that the flexible circuit board 340 is divided into a region in which the temperature sensor 143 is mounted and a region in which the auto-focusing device 330 is mounted due to the decoration 1431.

As described above, in the present invention, the temperature sensor 143 and the auto-focusing device 330 are disposed together on one flexible circuit board 340, and the disposed temperature sensor 143 and auto-focusing device 330 are modularized into one. Further, the auto-focusing device 330 operates together with the temperature sensor 143 at the time when the temperature sensor 143 operates. Therefore, when the temperature is measured via the temperature sensor 143, the controller 180 of the terminal 100 operates the auto-focusing device 330 to measure a distance to a temperature measurement object of the temperature sensor 143.

Furthermore, the controller 180 uses a compensation table stored in the memory to compensate the measured temperature via the temperature sensor 143 according to the measured distance via the auto-focusing device 330.

Figure 10:
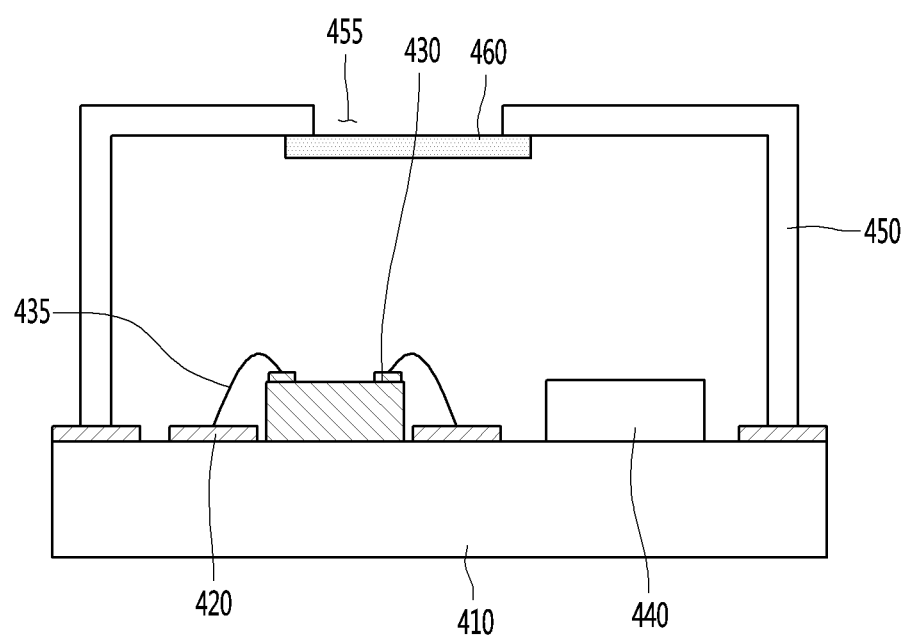
FIG. 10 is a cross-sectional view illustrating a detailed configuration of a temperature sensor 143 shown in FIG. 9.

FIG. 10 is a cross-sectional view illustrating a detailed configuration of a temperature sensor 143 shown in FIG. 9.

Referring to FIG. 10, the temperature sensor 143 includes a substrate 410, a circuit pattern 420, a first element 430, a second element 440, a sensor cover 450, and a filter 460.

The substrate 410 is a support substrate of an infrared temperature sensor in which a single pattern is formed. At this point, the substrate 410 may refer to one insulating layer, on which any one circuit pattern is formed, of a substrate having a plurality of laminated structures.

The substrate 410 may form an insulating plate, and may be a thermosetting or thermoplastic polymer substrate, a ceramic substrate, an organic-inorganic composite material substrate, or a glass fiber-impregnated substrate. The substrate 410 may include an epoxy-based insulating resin such as bismaleimide triazine (BT) and Ajinomoto build-up film (ABF) when including a polymer resin, or also include a polyimide-based resin unlike the above, but is not particularly limited thereto.

Preferably, the substrate 410 may be a substrate having high heat dissipation characteristics. For this, at least one additive may be added to a ceramic resin of ceramic material in the substrate 410.

Here, the additive to be added to the ceramic resin is preferably a nitride filler. The nitride filler to be added to the ceramic resin may include at least one of BN, AlN, $Al_2O_3$, and MgO.

That is, in the case of a general FR4 substrate, since thermal conductivity is as low as 0.5 W/mK, the heat generated from a device may not be smoothly discharged to the outside, and a temperature gradient between a hot junction and a cold junction of a sensor constituting the device is unstable, so that temperature accuracy is low.

In addition, in the case of a ceramic substrate, the thermal conductivity indicates high temperature accuracy at the level of 20 W/mK, but the price is high.

Therefore, in the present invention, a nitride filler is added to the ceramic resin as described above to have thermal conductivity of 20 W/mK similar to that of the ceramic substrate, and the plurality of elements are mounted respectively by using a new heat dissipation substrate which is cheaper than the ceramic substrate.

At least one circuit pattern 420 is formed at least one of the upper surface and lower surface of the substrate 410.

The circuit pattern 420 may be formed by a general process of manufacturing a printed circuit board (PCB), such as an additive process, a subtractive process, a modified semi additive process (MSAP), a semi additive process (SAP), etc., and detailed descriptions thereof will be omitted herein.

The circuit pattern 420 may include a plurality of patterns disposed to be spaced apart on the substrate 410 at a predetermined interval.

The circuit pattern 420 may include at least one surface treatment plated layer of silver, gold, and tin to copper.

A via (not shown) may be additionally formed at the substrate 410. The via may electrically connect circuit patterns 420 formed on different surfaces of the substrate 410 to each other.

The first element 430 is disposed on the substrate 410.

The first element 430 may be a thermopile.

The thermopile generates an electromotive force according to an external temperature, and supplies the electromotive force to the second element 440.

The thermopile includes a plurality of cold junctions and hot junctions provided on a semiconductor substrate, and first and second thermocouple wires alternately provided between the cold junction and the hot junction. Here, an external electrode connected to the first and second thermocouple wires, respectively, and an infrared absorbing layer provided on the hot junction are included. Further, a protective film provided on the entire structure including the first and second thermocouple wires may be further included. Furthermore, an insulating film provided at an upper portion of the semiconductor substrate may be formed.

At this point, the semiconductor substrate includes a body part and a cavity part provided at the center of the body part. It is preferable that a hot junction is formed on the insulating film at an upper region of the cavity part, and a cold junction is formed on the insulating film at an upper region of the body part. It is preferable that the infrared absorbing layer is provided at the upper region of the cavity part.

It is effective that the hot junction is provided along a periphery of the cavity part. A silicon wafer may be used as the semiconductor substrate, but is not limited thereto, and all wafers having semiconductor characteristics may be used.

The insulating film may be a thin film having low thermal conductivity, and in the present embodiment, it is preferable to form the insulating film using at least one of thin films of a polymer-based material film such as a silicon nitride film (SixNx), a silicon oxide film (SiOx), a fluoride-based film (MgF$_2$, CaF$_2$, BaF$_2$), an aluminum oxide film (Al$_2$O$_3$), and a silicon carbide film (SIC). Such an insulating film may be fabricated in a form in which a plurality of thin films are laminated.

It is preferable that the first and second thermocouple wires are connected in series, each constituent material of each thermocouple has a large thermoelectromotive force, and the first and second thermocouple wires are made of different materials having opposite polarities of thermoelectromotive force. It is preferable that the first and second thermocouple wires are located to intersect the hot junction and the cold junction, and the hot junction and the cold junction are thermally isolated from each other.

The first and second thermocouple wires are connected in serial between a plurality of hot junctions and cold junctions alternately. For example, a first second thermocouple wire is connected between the first hot junction and the first cold junction, a first thermocouple wire is connected between the first cold junction and the second hot junction, and a second thermocouple wire is connected between the second hot junction and the second cold junction. Here, it is preferable to use a semiconductor film and a metal thin film as the first and second thermocouple wires. That is, a silicon film and aluminum film, a germanium film and aluminum film, a Cr film and Al film, a Pt film and Rh film may be used as the first and second thermocouple wires. At this point, as the silicon film, a silicon film doped with impurities may be used, or a polysilicon film may be used. The present invention is not limited to the thermocouple, and a thermoelectric conversion element for temperature measurement including a super-conducting element or the like may be used. At this point, the first and second thermocouple wires may be laminated and fabricated.

The first element 430 according to the present embodiment is not limited to the above description, and various modifications are possible.

The second element 440 is an application specific integrated circuit (ASIC) in which a plurality of circuits is formed as a single chip for processing a signal sensed via the first element 430.

The second element 440 processes the signal sensed via the first element 430.

For this, the second element 440 may include an amplifier (not shown), an operator (not shown), a data converter (not shown), a memory (not shown), and the like.

The amplifier amplifies an input signal and outputs the amplified signal.

The operator controls an overall operation of the second element 440. That is, the operator not only has a function of processing the signal of the sensed signal, but also a function of eliminating the signal deviation between each of components, a function of correcting the temperature and the signal, and a function of controlling the input/output of the signal. The operator may be implemented as a microcomputer (MICOM).

The data converter performs a data conversion operation between an analog signal and a digital signal. That is, the detected signal via the first element 430 is an analog signal, and the data converter converts the analog signal into a digital signal that may be processed by the second element 440.

The memory stores signals processed in the respective components and various information necessary for signal processing in the respective components.

The sensor cover 450 is disposed on the substrate 410, an accommodation space is provided therein, an upper region of the first element 430 is exposed, and a hole 455 transmitting the infrared rays introduced from the outside is formed.

The sensor cover 450 may be formed of a material such as polycarbonate, polyethylene (PE), polyetheretherketone (PEEK), or the like. In addition, the sensor cover 450 may be formed of a metal material such as brass, aluminum, or stainless steel.

At this point, the hole 455 formed at the sensor cover 450 is formed in a region corresponding to a position in which the first element 430 accommodated in the sensor cover 450 is disposed.

The sensor cover 450 is provided with a filter 460 covering the hole 455 and transmitting only the wavelength band of the infrared region to perform optical focusing.

The filter 460 may be a spherical or aspherical lens formed of a material capable of transmitting infrared rays, including silicon.

A connection member 435 electrically connects the first element 430 and the circuit pattern 420. The connection member 435 may be composed of a wire.

The above-described temperature sensor 143 has a structure in which a first element 430 and a second element 440 are disposed on a substrate 410.

Therefore, in the composite module 400, a temperature sensor 143 and an auto-focusing device 330 are disposed on the flexible circuit board 340, and the substrate 410 constituting the temperature sensor 143 and the auto-focusing device 330 are respectively disposed on the flexible circuit board 340 substantially.

As described above, in the present invention, the substrate on which the plurality of elements constituting the temperature sensor 143 are mounted and the substrate on which the auto-focusing device 330 is mounted are divided from each other. In other words, the temperature sensor 143 substantially has a structure in which a plurality of elements are mounted on a substrate 410, and the substrate 410 on which the plurality of elements are mounted is disposed on the flexible circuit board 340. The auto-focusing device 330 is mounted directly on the flexible circuit board 340. Therefore, the heat generated in the auto-focusing device 330 is not transmitted to the temperature sensor 143 via the flexible circuit board 340.

Figure 11:
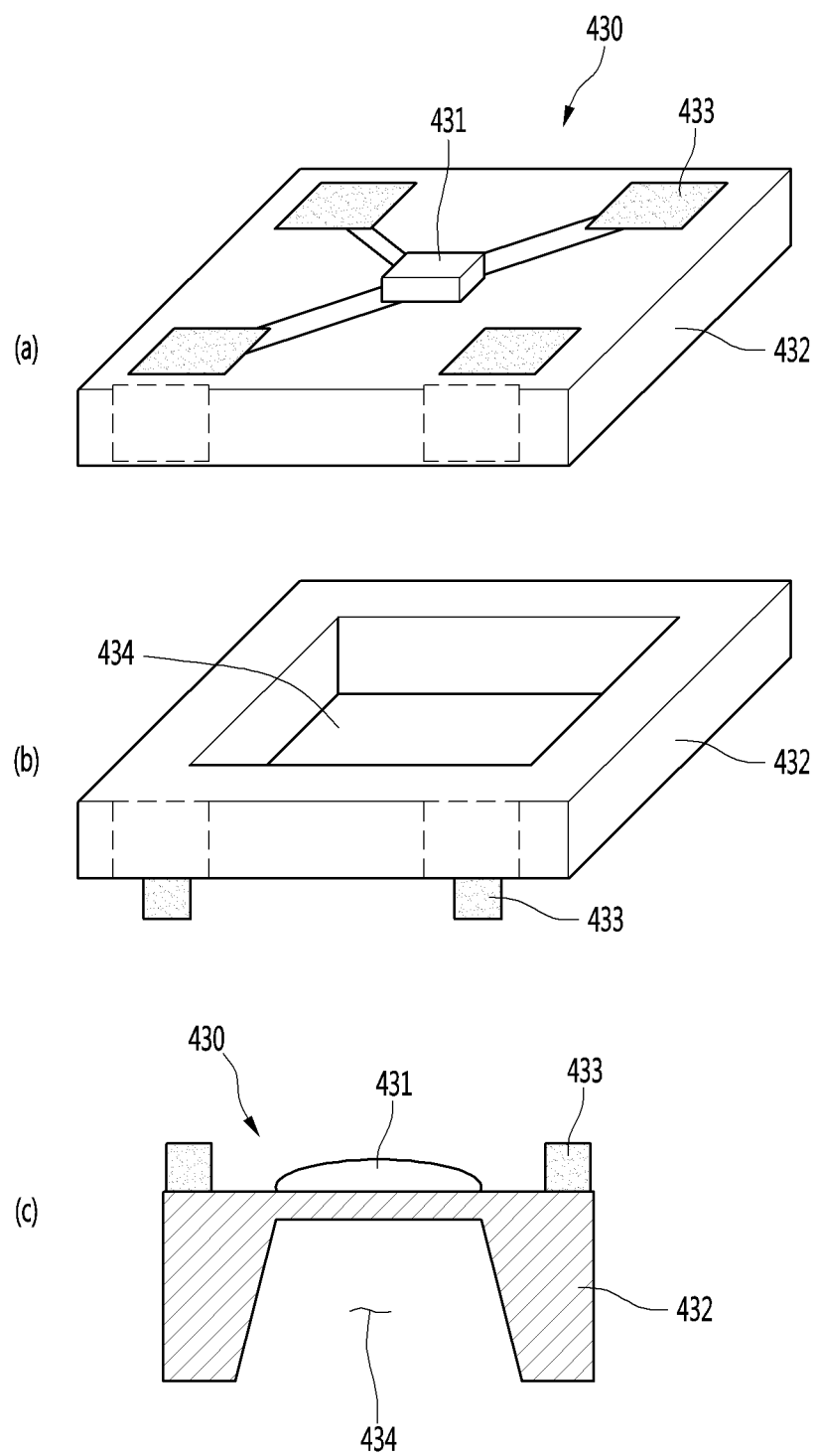
FIG. 11 is a view illustrating a detailed structure of a first element shown in FIG. 10.

FIG. 11 is a view illustrating a detailed structure of a first element shown in FIG. 10.

Referring to FIG. 11, (a) is a perspective view of a first element according to an embodiment of the present invention, in which a temperature sensing part 431 for detecting temperature via a sensing material or a sensing chip may be disposed at a surface of a body 432, an electrode pattern 433 capable of connecting to an external terminal at an adjacent surface may be provided, and the temperature sensing part 431 and the electrode pattern 433 may be electrically connected to each other.

(b) of FIG. 11 illustrates a lower surface of the first element 430 shown in (a), and may be formed to have a structure in which a predetermined cavity 434 is formed in the body 432.

(c) of FIG. 11 illustrates a cross-sectional view of the first element.

As shown in (c) of FIG. 11, each of a plurality of electrode patterns 433 is formed on the upper surface of the body, and the electrode pattern 433 is electrically connected to the second element 440 to transmit signals.

Figure 12:
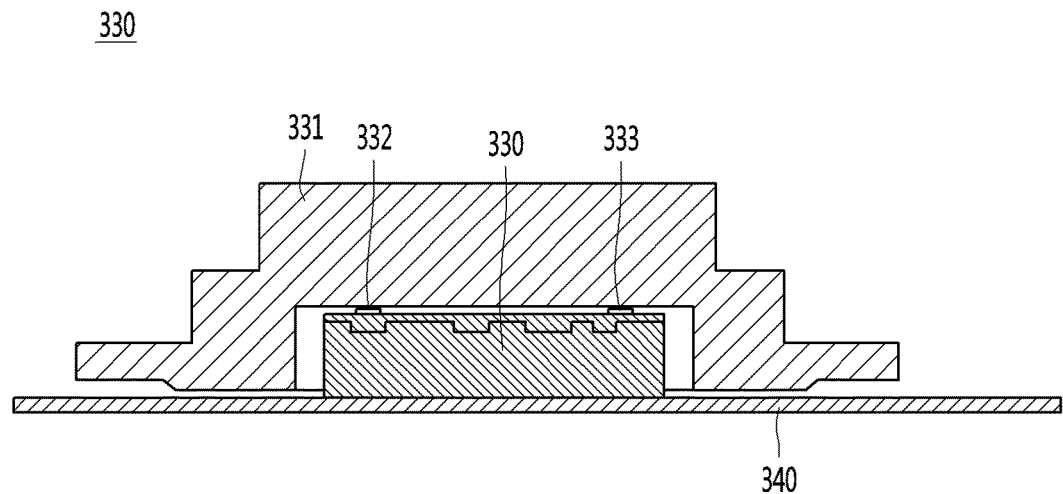
FIG. 12 is a cross-sectional view illustrating a detailed configuration of an auto-focusing device 330 shown in FIG. 9.

FIG. 12 is a cross-sectional view illustrating a detailed configuration of an auto-focusing device 330 shown in FIG. 9.

Referring to FIG. 12, the auto-focusing device 330 includes a light emitting part 332 and a light receiving part 333 disposed on the flexible circuit board 340 at a predetermined interval.

The light emitting part 332 transmits laser in an upward direction, and the light receiving part 333 receives the laser reflected from a measurement object.

In addition, a window 331 is disposed at an upper region of the light emitting part 332 and an upper region of the light receiving part 333, that is, in a region corresponding to a laser exit surface of the light emitting part 332 and a laser incident surface of the light receiving part 333. At this point, the window 331 is formed of a light-transmitting material capable of transmitting the laser.

The above-described auto-focusing device 330 measures a distance to a measurement object by using a phase difference between an output signal of the light emitting part 332 and a received signal of the light receiving part 333.

In addition, when a photograph or a moving image is captured via a camera, the controller 180 of the terminal 100 automatically focuses a distance using the distance measured via the auto-focusing device 330. In other words, the terminal 100 is equipped with an auto-focusing device 330 that performs an auto-focusing function. In the present invention, the auto-focusing device 330 and the temperature sensor 143 are formed as a single module, so that the function of the auto-focusing device 330 and the function of the temperature sensor 143 may be used together.

Meanwhile, the above-described auto-focusing device 330 may measure a distance to a measurement object quickly by measuring a distance using a phase difference via the laser.

Figure 13:
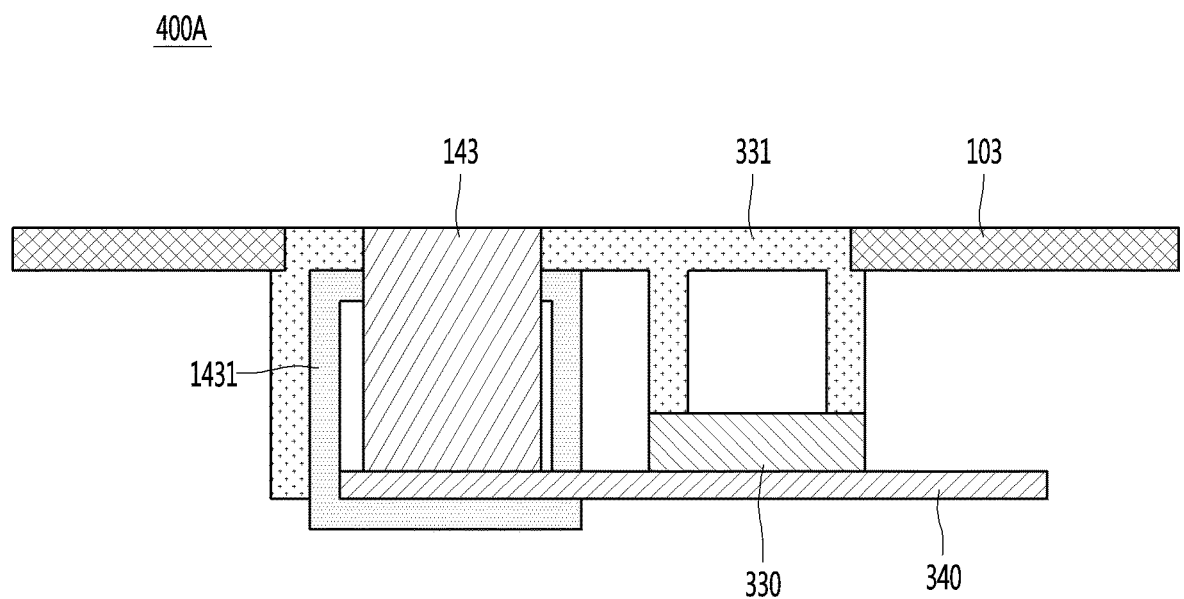
FIG. 13 is a view illustrating a composite module 400A according to another embodiment of the present invention.

FIG. 13 is a view illustrating a composite module 400A according to another embodiment of the present invention.

Referring to FIG. 13, the composite module 400A includes a flexible circuit board 340, a temperature sensor 143, a window 331, a rear cover 103, and a decoration 1431.

Referring to FIG. 13, a temperature sensor 143 and an auto-focusing device 330 are respectively disposed on the flexible circuit board 340 at a predetermined interval.

In addition, an upper portion of the temperature sensor 143 is exposed to the outside through a hole formed in the rear cover 103 of the terminal 100. More preferably, the temperature sensor 143 may have a hole formed on an upper surface thereof, and a filter (to be described later) may be disposed at the formed hole. The filter may be a spherical silicon lens.

That is, the rear cover 103 of the terminal 100 exposes a silicon optical portion of the temperature sensor 143 to the outside.

A separate window 331 for the auto-focusing device 330 is provided on the auto-focusing device 330. The window 331 is formed of a light-transmitting material that transmits light from the outside while protecting an inside of the auto-focusing device 330.

Further, a decoration 1431 is disposed to surround the temperature sensor 143. The decoration 1431 surrounds the temperature sensor 143 and divides a temperature sensor forming portion 340d of the flexible circuit board 340 into a plurality of regions.

That is, the decoration 1431 is disposed to surround the temperature sensor 143 so that the temperature sensor forming portion 340d of the flexible circuit board 340 is divided into a region in which the temperature sensor 143 is disposed and a region in which the auto-focusing device 330 is disposed.

In other words, the temperature sensor 143 is vulnerable to heat, and thus heat generated from the auto-focusing device 330 may affect temperature measurement environment of the temperature sensor 143. Therefore, the decoration 1431 divides an arrangement region of the temperature sensor 143 and the auto-focusing device 330 while protecting the temperature sensor 143, so that the heat generated from the auto-focusing device 330 does not affect operational environment of the temperature sensor 143.

Meanwhile, a lower portion of the decoration 1431 does not surround only the temperature sensor 143 but surrounds a lower surface of the flexible circuit board 340 overlapping with the region in which the temperature sensor 143 is disposed together with the temperature sensor 143.

Therefore, the heat flowing in through the lower surface of the flexible circuit board 340 may be blocked, and thus operational reliability of the temperature sensor 143 can be further improved.

Meanwhile, the decoration 1431 is not in direct contact with an outer surface of the temperature sensor 143 but is spaced apart from the outer surface of the temperature sensor 143 at a predetermined distance. Therefore, an air gap is formed between the decoration 1431 and the temperature sensor 143. The air gap may block heat or noise introduced from the outside, and thus operational reliability of the temperature sensor 143 can be further improved.

Meanwhile, the window 331 covers an upper region of the auto-focusing device 330 and simultaneously, surrounds the temperature sensor 143. In other words, the window 331 is formed to surround a periphery of the decoration 1431. Therefore, the window 331 is disposed at the other region of the upper surface of the temperature sensor 143 except the region in which the filter is formed.

In other words, the window 331 is disposed to surround an upper region of the temperature sensor 143 while covering the upper region of the auto-focusing device 330.

As described above, in a second embodiment of the present invention, the cover for covering the upper portion of the temperature sensor 143 is formed by using the window 331 for the auto-focusing device 330, so that the sense of unity of the composite module including the temperature sensor and the auto-focusing device 330, may be improved, and thus convenience of design for a user can be improved.

Figure 14:
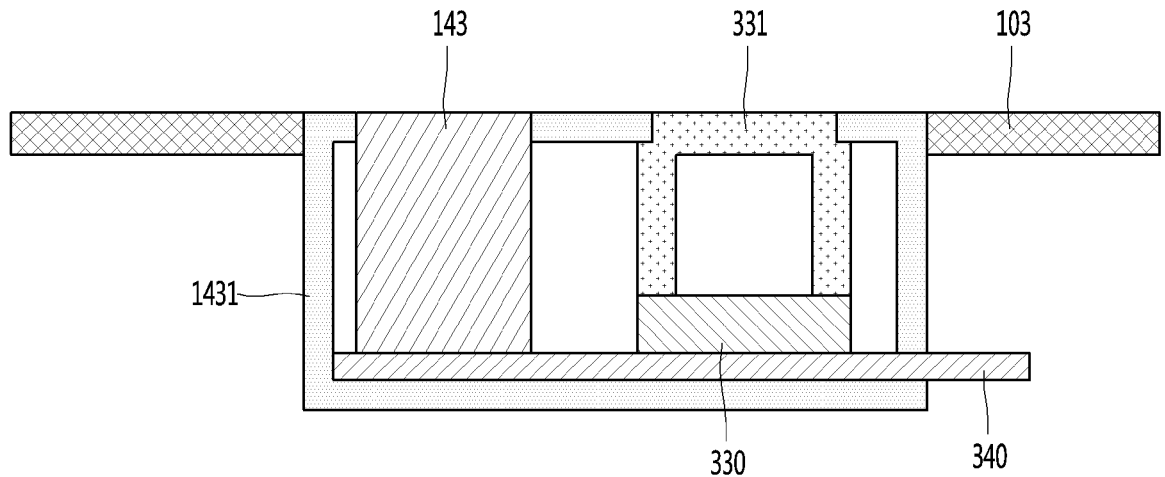
FIG. 14 is a view illustrating a composite module 400B according to still another embodiment of the present invention.

FIG. 14 is a view illustrating a composite module 400B according to still another embodiment of the present invention.

Referring to FIG. 14, the composite module 400B includes a flexible circuit board 340, a temperature sensor 143, a window 331, a rear cover 103, and a decoration 1431.

Referring to FIG. 14, a temperature sensor 143 and an auto-focusing device 330 are respectively disposed on the flexible circuit board 340 at a predetermined interval.

In addition, an upper portion of the temperature sensor 143 is exposed to the outside through a hole formed in the rear cover 103 of the terminal 100. More preferably, the temperature sensor 143 may have a hole formed on an upper surface thereof, and a filter (to be described later) may be disposed at the formed hole. The filter may be a spherical silicon lens.

That is, the rear cover 103 of the terminal 100 exposes a silicon optical portion of the temperature sensor 143 to the outside.

A separate window 331 for the auto-focusing device 330 is provided on the auto-focusing device 330. The window 331 is formed of a light-transmitting material that transmits light from the outside while protecting an inside of the auto-focusing device 330.

Further, a decoration 1431 is disposed to surround the temperature sensor 143. The decoration 1431 surrounds the temperature sensor 143 and divides a temperature sensor forming portion 340d of the flexible circuit board 340 into a plurality of regions.

That is, the decoration 1431 is disposed to surround an outer surface of the composite module 400B. In other words, as shown in another embodiment of the present invention, the decoration 1431 is not disposed to surround only the temperature sensor 143 but disposed to surround the temperature sensor 143 and the auto-focusing device 330.

Therefore, the hole of the rear cover 103 includes a region in which the window 331 is exposed, a region in which the upper surface of the temperature sensor 143 is exposed, and a region in which an upper surface of the decoration 1431 is exposed.

In other words, the decoration 1431 includes an upper decoration disposed on the flexible circuit board 340 to surround the composite module and a lower decoration disposed under the upper decoration to surround the lower region of the flexible printed circuit board on which the temperature sensor and auto-focusing device are mounted.

At this point, the upper decoration may include a first upper decoration disposed in a first hole of the rear cover to surround an upper region of the temperature sensor and a second upper decoration disposed in a second hole of the rear cover to surround an upper region of the window.

Therefore, the first and second holes of the rear cover may include a region in which the first upper decoration is exposed, a region in which the upper surface of the temperature sensor is exposed, a region in which the window is exposed, and a region in which the second upper decoration is exposed.

At this point, looking at the composite module from the outside, it can be seen that the outside of the composite module has a structure surround by one of the upper decorations, so that the temperature sensor and the auto-focusing device are configured as one module.

As described above, in a third embodiment of the present invention, the decoration of the temperature sensor is used as the case of the composite module, so that the sense of unity of the composite module including the temperature sensor and the distance sensor may be improved, and thus design of convenience can be improved.

Figure 15:
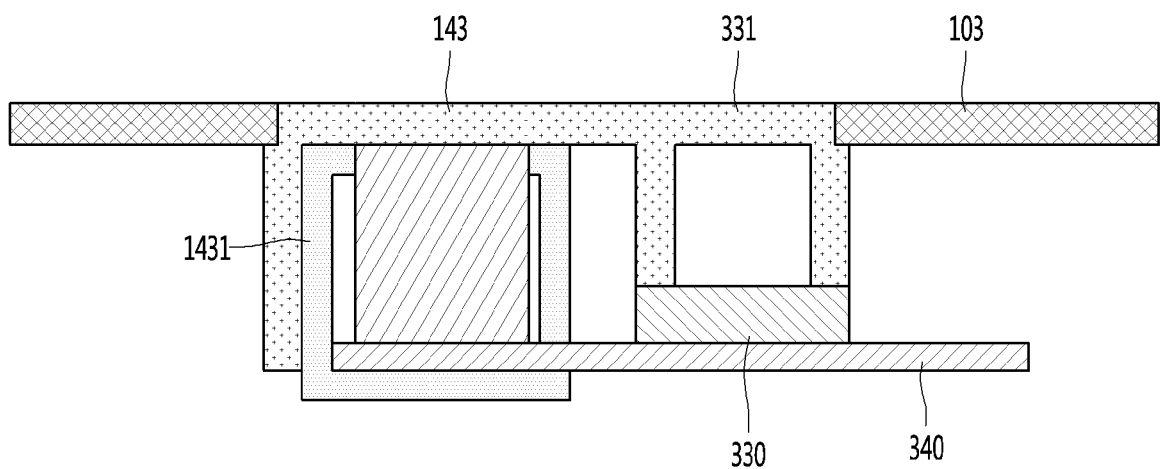
FIG. 15 is a view illustrating a composite module 400C according to yet another embodiment of the present invention.
Figure 16:
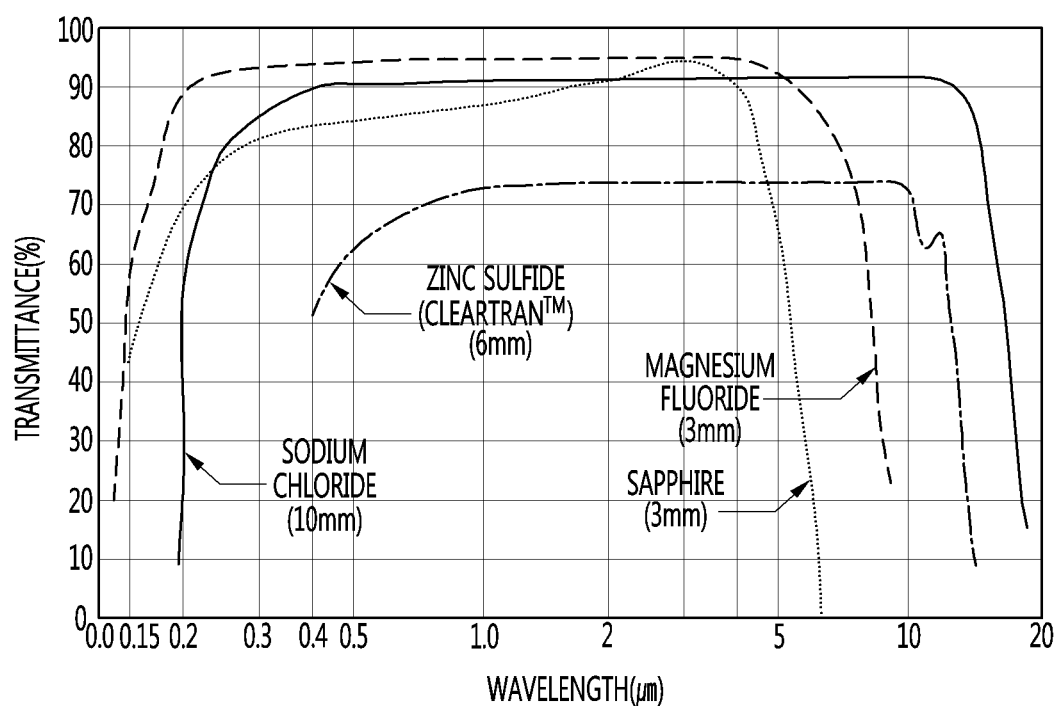
FIG. 16 is a view for explaining characteristics of a window in FIG. 15.

FIG. 15 is a view illustrating a composite module 400C according to yet another embodiment of the present invention, and FIG. 16 is a view for explaining characteristics of a window of FIG. 15.

Referring to FIG. 15, the composite module 400C includes a flexible circuit board 340, a temperature sensor 143, a window 331, a rear cover 103, and a decoration 1431.

Referring to FIG. 15, a temperature sensor 143 and an auto-focusing device 330 are respectively disposed on the flexible circuit board 340 at a predetermined interval.

In addition, an upper portion of the temperature sensor 143 is exposed to the outside through a hole formed in the rear cover 103 of the terminal 100. More preferably, the temperature sensor 143 may have a hole formed on an upper surface thereof, and a filter (to be described later) may be disposed at the formed hole. The filter may be a spherical silicon lens.

That is, the rear cover 103 of the terminal 100 exposes a silicon optical portion of the temperature sensor 143 to the outside.

At this point, an uppermost portion of the temperature sensor 143 is positioned lower than a surface of the rear cover 103.

A separate window 331 for the auto-focusing device 330 is provided on the auto-focusing device 330. The window 331 is formed of a light-transmitting material that transmits light from the outside while protecting an inside of the auto-focusing device 330.

Further, a decoration 1431 is disposed to surround the temperature sensor 143. The decoration 1431 surrounds the temperature sensor 143 and divides a temperature sensor forming portion 340d of the flexible circuit board 340 into a plurality of regions.

That is, the decoration 1431 is disposed to surround the temperature sensor 143 so that the temperature sensor forming portion 340d of the flexible circuit board 340 is divided into a region in which the temperature sensor 143 is disposed and a region in which the auto-focusing device 330 is disposed.

In other words, the temperature sensor 143 is vulnerable to heat, and thus heat generated from the auto-focusing device 330 may affect temperature measurement environment of the temperature sensor 143. Therefore, the decoration 1431 divides an arrangement region of the temperature sensor 143 and the auto-focusing device 330 while protecting the temperature sensor 143, so that the heat generated from the auto-focusing device 330 does not affect operational environment of the temperature sensor 143.

Meanwhile, a lower portion of the decoration 1431 does not surround only the temperature sensor 143 but surrounds a lower surface of the flexible circuit board 340 overlapping with a region in which the temperature sensor 143 is disposed together with the temperature sensor 143.

Therefore, the introduced heat via the lower surface of the flexible circuit board 340 may be blocked, and thus operational reliability of the temperature sensor 143 can be further improved.

Meanwhile, the decoration 1431 is not in direct contact with an outer surface of the temperature sensor 143 but is spaced apart from the outer surface of the temperature sensor 143 at a predetermined distance. Therefore, an air gap is formed between the decoration 1431 and the temperature sensor 143. The air gap may block heat or noise introduced from the outside, and thus operational reliability of the temperature sensor 143 can be further improved.

Meanwhile, the window 331 covers an upper region of the auto-focusing device 330 and simultaneously, covers the upper portion of the temperature sensor 143.

In other words, the window 331 covers the upper portion of the temperature sensor 143 while covering the light emitting part and the light receiving part constituting the auto-focusing device 330.

Therefore, an upper surface of the composite module 400 including the auto-focusing device 330 and the temperature sensor 143 is covered by the window 331 in common.

At this point, the condition that a window of the auto-focusing device 330 should have and the condition that a window of the temperature sensor 143 should have are different from each other.

For this, in order to satisfy both the condition that the window of the auto-focusing device 330 should have and the condition of the window that the temperature sensor 143 should have, the window 331 is formed of a material capable of transmitting both infrared rays of a short wavelength and infrared rays of a long wavelength.

Referring to FIG. 16, materials such as sodium chloride, sapphire, and magnesium fluoride are materials having a wide transmission range. Accordingly, when the window 331 is manufactured by using the materials, it is possible to transmit both infrared rays of short and long wavelengths.

As described above, in a fourth embodiment of the present invention, the cover for covering the upper portion of the temperature sensor 143 is formed by using the window 331 for the auto-focusing device 330, so that the sense of unity of the composite module including the temperature sensor and the auto-focusing device 330, may be improved, and thus convenience of design for a user can be improved.

Figure 17:
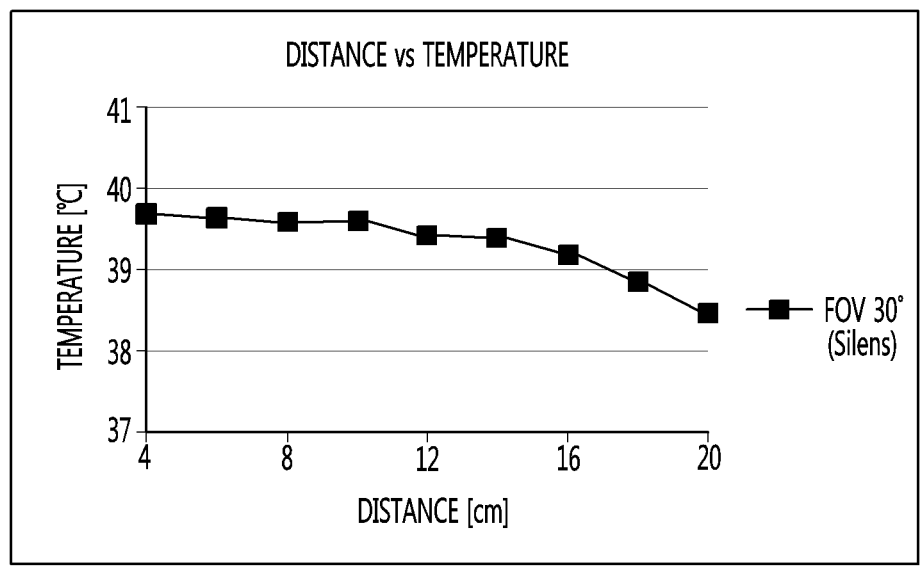
FIGS. 17 and 18 are views for explaining temperature compensation characteristics according to an embodiment of the present invention.
Figure 18:
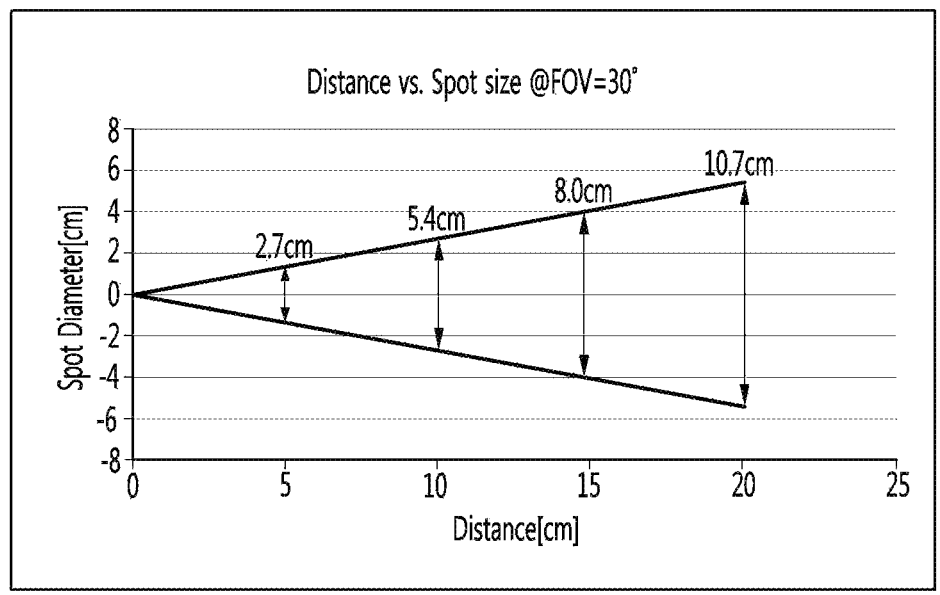

FIGS. 17 and 18 are views for explaining temperature compensation characteristics according to an embodiment of the present invention.

*299 Referring to FIGS. 17 and 18, the temperature was measured by using a non-contact infrared temperature sensor of a thermopile type having a field of view (FOV) of 30 degrees while changing the distance of a measurement object at 40° C.

As shown in FIGS. 17 and 18, it can be seen that the measurement temperature measured via the temperature sensor 143 decreases as the distance to the measurement object increases. Further, as shown in FIG. 16, although the target is positioned in the FOV range even at a measurement distance of 20 cm with a diameter of the measurement object of 15 cm, it was confirmed that the measurement temperature was continuously decreased as the distance to the object increases, and the measurement temperature was abruptly decreased after about 16 cm.

Therefore, in the present invention, a degree of change of the measurement temperature that varies with the distance to the measurement object is analyzed, and accordingly, a compensation table capable of compensating for the change in the measurement temperature is stored in the memory to compensate the measured temperature via the temperature sensor 143 according to the measured distance via the auto-focusing device 330.

Meanwhile, in the present invention, the auto-focusing device 330 is used as a device for measuring the distance to the measurement object. However, in the case of a device in which the auto-focusing device 330 is not provided, a different type of sensor capable of sending a distance may also be used. In other words, an ultrasonic sensor may be modularized together with the temperature sensor 143 in place of the auto-focusing device 330.

Figure 19:
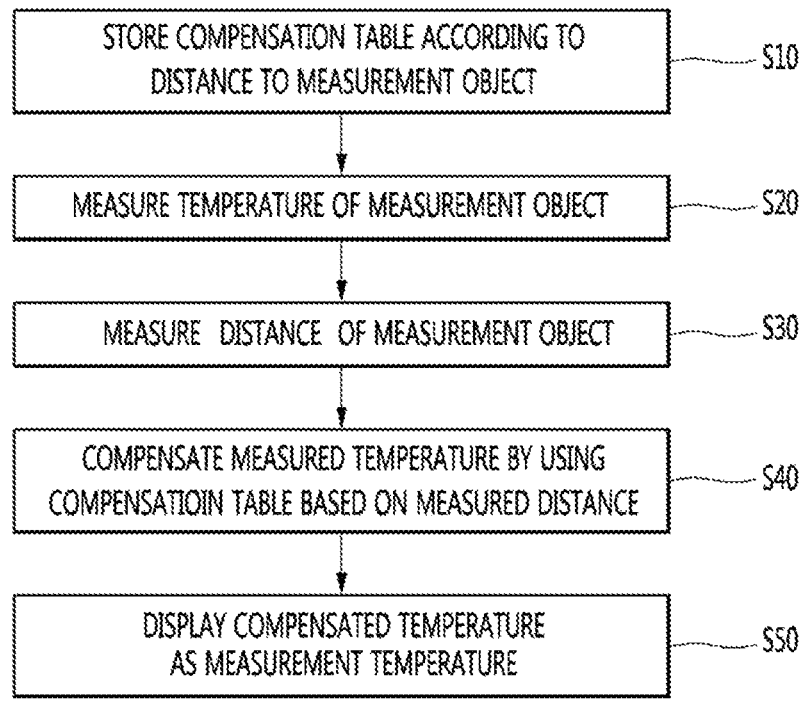
FIG. 19 is a flowchart for explaining step by step a method for compensating a temperature of a temperature sensor 143 according to an embodiment of the present invention.

FIG. 19 is a flowchart for explaining step by step a method for compensating a temperature of a temperature sensor 143 according to an embodiment of the present invention.

First, in the present invention, a change relationship of temperature measured with respect to a measurement object is analyzed according to a change in distance to the measured object, a temperature compensation table for compensating for the temperature change is determined and stored in the memory at step S10.

Furthermore, the controller 180 causes the temperature of the measurement object to be measured via the temperature sensor 143 and receives the measured temperature at step S20.

In addition, the controller 180 causes the distance to the measurement object to be measured via the auto-focusing device 330 and receives the measured distance at step S30. At this point, when the temperature sensor 143 operates, the controller 180 drives the auto-focusing device 330 together with the temperature sensor 143 to perform the distance measurement together with the temperature measurement.

Furthermore, the controller 180 extracts a temperature compensation value according to the distance to the measurement object by using the compensation table stored in the memory, and compensates the measured temperature by applying the extracted temperature compensation value at step S40.

In addition, the controller 180 displays the compensated temperature information according to the distance at step S50.

Figure 20:
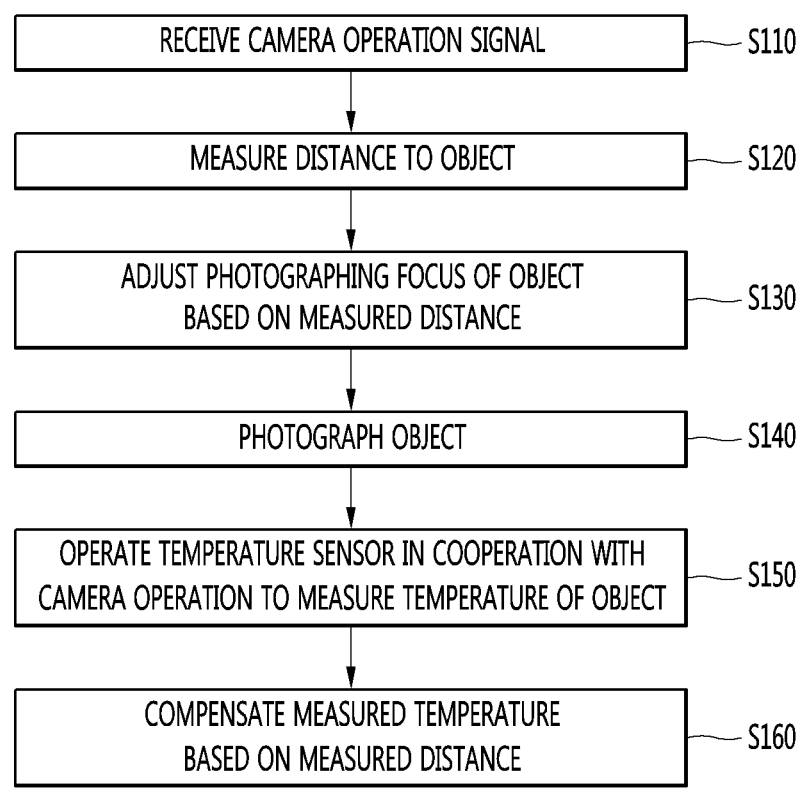
FIG. 20 is a view for explaining step by step a method for driving a composite module according to an embodiment of the present invention.

FIG. 20 is a diagram for explaining step by step a method for driving a composite module according to an embodiment of the present invention.

Referring to FIG. 20, the controller 180 may operate the composite module 400 in cooperation with the operation of the camera 121. In other words, the controller 180 operates the auto-focusing device 330 and the temperature sensor 143 constituting the composite module 400 in cooperation with the operation of the camera 121.

For this, the controller 180 receives a camera operation signal input from the outside at step S110. The camera operation signal may be an execution command of an application for driving the camera.

Further, the controller 180 operates the auto-focusing device 330 at the time when the camera 121 operates. The auto-focusing device 330 measures a distance between the object to be photographed by the camera 121 and the camera 121 at step S120.

The controller 180 adjusts a photographing focus for the operation of the camera 121 according to the distance to the measured object via the auto-focusing device 330 at step S130.

Accordingly, the camera 121 may perform an image photographing operation to obtain a photographed image with an accurate focus at step S140.

At this time, the controller 180 uses the distance information used for the operation of the camera 121, that is, the information of the auto-focusing device 330 for the auto-focusing at the time of operating the camera 121 and controls the operation of the temperature sensor 143.

In other words, at the time when the camera 121 operates, the controller 180 causes the temperature measurement of the temperature sensor 143 to be performed with respect to the object to be photographed by the camera 121 at step S150.

At this point, a composite module 400 including the camera 121, the temperature sensor 143, and the auto-focusing device 330 is disposed in a line on the mobile terminal. Accordingly, the object to be photographed by the camera 121, the object to be distance-measured by the auto-focusing device 330, and the object to be temperature-measured by the temperature sensor 143 may all be the same object.

Therefore, the object to be photographed by the camera 121 and the temperature measurement object of the temperature sensor 143 are the same object, and accordingly, the controller 180 compensates the measured temperature via the temperature sensor 143 using the distance information with respect to the obtained object at the time when the camera 121 operates at step S160.

Accordingly, the controller 180 may drive the composite module 400 together with the operation of the camera 121, so that detailed information on the object to be photographed by the camera 121 may be obtained.

Figure 21:
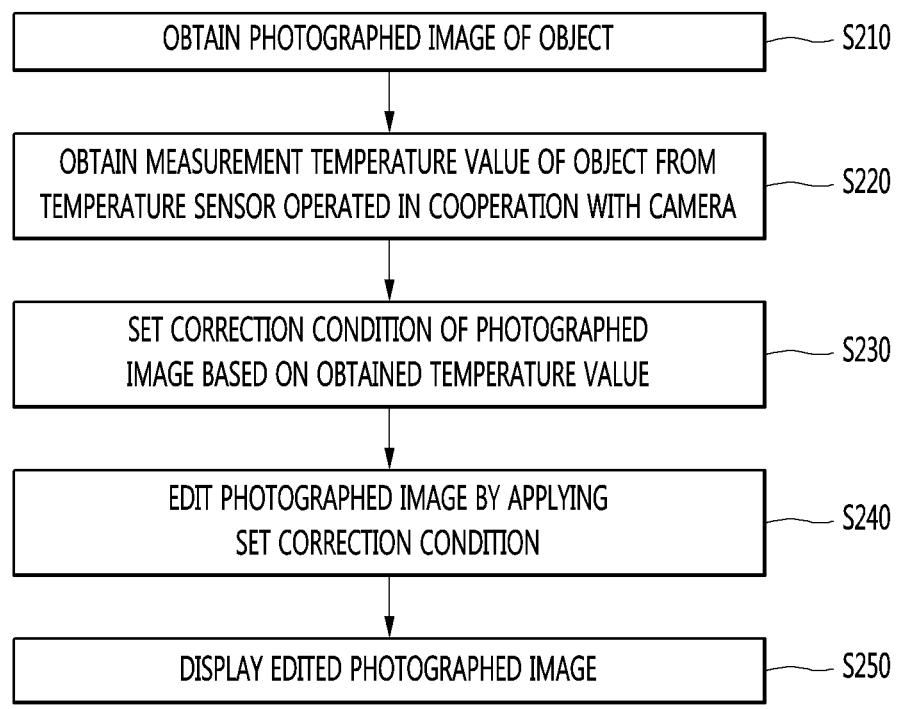
FIG. 21 is a flowchart for explaining step by step a method for editing an image of a mobile terminal according to an embodiment of the present invention.

FIG. 21 is a flowchart for explaining step by step a method for editing an image of a mobile terminal according to an embodiment of the present invention.

Referring to FIG. 21, the controller 180 edits the image photographed by the camera 121 based on the measurement temperature of the temperature sensor 143, which is operated in cooperation with the camera 121.

For this, the controller 180 obtains a photographed image via the camera 121 at step S210, the controller 180 obtains a temperature value of the photographed object via the camera 121 from the temperature sensor 143 operated in cooperation with the camera at step S220.

Furthermore, the controller 180 sets a correction condition of the photographed image via the camera 121 based on the obtained temperature value at step S230.

In addition, when the correction condition is set, the controller 180 corrects and edits the photographed image via the camera 121 based on the set correction condition at step S240.

Further, when the image is corrected and edited, the controller 180 displays the edited image according to a display request from the outside at step S250.

That is, the camera 121 may obtain different images depending on a state of the object to be photographed. In other words, when the temperature of the object is high, the camera 121 can obtain an image having a high color temperature, and when the temperature of the object is low, the camera 121 may obtain an image having a low color temperature.

Therefore, the controller 180 determines a correction condition of the image photographed by the camera 121 according to a result value of the composite module 400, which is operated in cooperation with the camera 121. The correction condition may include a color temperature of the image, and may further include contrast, brightness, sharpness and the like of the image.

For example, when the temperature of the photographed object is high, the controller 180 may edit the photographed image via the camera 121 to have a warm color temperature, and when the temperature of the photographed object is low, the controller 180 may edit the photographed image via the camera 121 to have a cold color temperature. At this point, the correction condition information of the photographed image according to the temperature of the object to be photographed via the camera 121 may be stored in the memory. Further, the controller 180 corrects and edits the photographed image via the camera 121 according to the temperature of the obtained object by using the stored correction condition information.

Figure 22:
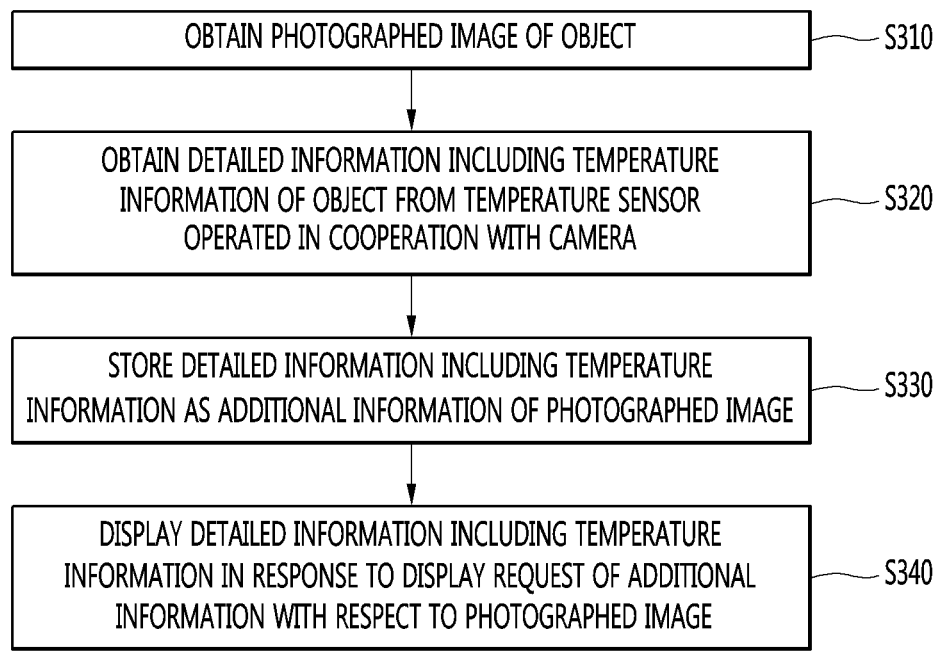
FIG. 22 is a flowchart for explaining step by step a method for storing a photographed image of a mobile terminal according to an embodiment of the present invention.

FIG. 22 is a flowchart for explaining step by step a method for storing a photographed image of a mobile terminal according to an embodiment of the present invention, and FIG. 23 is a diagram illustrating additional information of a photographed image according to an embodiment of the present invention.

Referring to FIG. 20, when an image is photographed via the camera 121, additional information on the photographed image is stored in the memory.

Referring to FIG. 23, the additional information may include title, photographing date/time, media type, resolution, photographing direction, file size, manufacturer, model name, flash status, focal length, white balance status, aperture status, exposure time, ISO information, file path information and the like of the image.

At this point, the controller 180 may include the measured temperature information via the temperature sensor 143 of the composite module 400, which is operated in cooperation with the camera 121, in the additional information of the photographed image so as to store in the memory.

That is, the controller 180 obtains the photographed image via the camera 121, and obtains the detailed information including the temperature information of the object from the temperature sensor 143 operated in cooperation with the camera 121 at steps S310 and S320. In other words, the controller 180 obtains the temperature information of the object from the temperature sensor 143, and obtains the information obtained at the time when the image is photographed by another additional device.

In addition, when the photographed image is stored, the controller 180 stores the temperature information obtained by the temperature sensor 143 operated in cooperation with the camera 121 as additional information of the photographed image in step S330.

In addition, the controller 180 displays the detailed information including the temperature information according to a display request of the additional information of the photographed image at step S340.

That is, referring to FIG. 23, the additional information of a specific photographed image may further include the temperature information of an object (subject) together with title, photographing date/time, media type, resolution, photographing direction, file size, manufacturer, model name, flash status, focal length, white balance status, aperture status, exposure time, ISO information, and file path information of the image.

Figure 24:
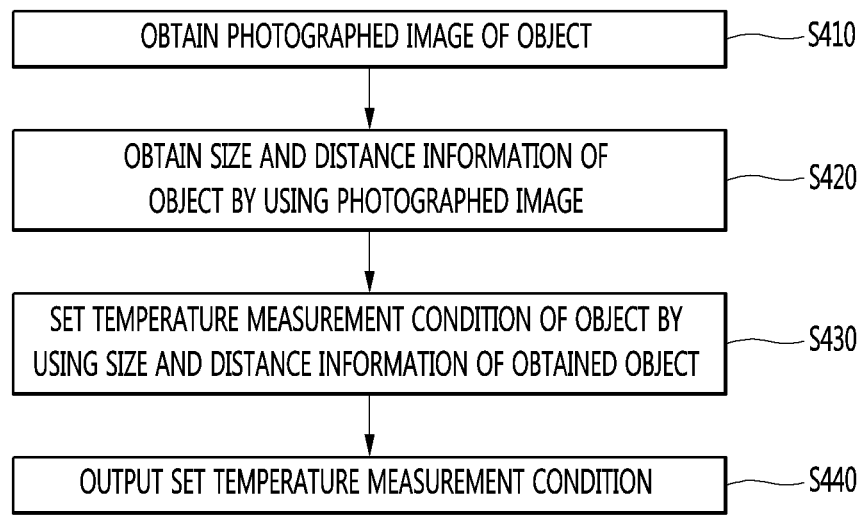
FIG. 24 is a view for explaining step by step a method for setting a temperature sensor measurement condition according to an embodiment of the present invention.

FIG. 24 is a diagram for explaining step by step a method for setting a temperature sensor measurement condition according to an embodiment of the present invention.

Referring to FIG. 24, the controller 180 sets a temperature measurement condition of the temperature sensor 143 by using a photographed image via the camera 121 when the operation of the temperature sensor 143 is performed in cooperation with the operation of the camera 121.

In other words, when the photographed image is obtained via the camera 121 at step S410, the controller 180 analyzes the obtained image and confirms a state of an object included in the photographed image at step S420.

At this point, the state of the object includes distance information between the mobile terminal and the object, and size information of the object. Here, the distance information may use information obtained from the auto-focusing device.

In addition, in general, the temperature sensor 143 receives the infrared rays radiated from the object while having a predetermined angle of view, and performs temperature measurement, and when the size of the object is out of range of an angle of view according to the distance, it is difficult to measure normal temperature.

Accordingly, when the distance and size information of the object is obtained, the controller 180 sets a temperature measurement condition capable of performing an optimal temperature measurement via the temperature sensor 143 by using the obtained distance and size information at step S430. Here, the temperature measurement condition may include a distance condition between the temperature sensor 143 and the object according to the size of the object.

When the temperature measurement condition is set, the controller 180 displays information on the set temperature measurement condition at step S440.

In other words, when the temperature of the object is measured in cooperation with the camera 121, the controller

180 informs whether the object is within or out of the viewing angle of the temperature sensor 143 according to the size and distance of the object.

Further, when the object is not coming in the angle of view of the temperature sensor 143 because the distance to the object is too far away, the controller 180 may output command information for performing temperature measurement at a position closer to the object.

According to an embodiment of the present invention, a change in measured temperature according to a distance to an object may be compensated by using a laser detection auto focusing (LDAF) device generally provided in a portable terminal, and thus accuracy of a measurement temperature can be improved.

In addition, according to an embodiment of the present invention, a temperature sensor and a distance sensor may be modularized into a single composite module, so that an area and volume occupied by each sensor may be reduced, and thus a time and a cost required for manufacturing can be reduced.

Further, according to an embodiment of the present invention, a sense of unity of the composite module including the temperature sensor and the distance sensor may be improved by using a window of LDAF as a case of the composite module, and thus convenience of design for a user can be increased.

Further, according to an embodiment of the present invention, a sense of unity of the composite module including the temperature sensor and the distance sensor may be improved by using a decoration of the temperature sensor as a case of the composite module, and thus convenience of design can be increased.

Further, according to an embodiment of the present invention, influence of the temperature sensor on thermal noise generated inside the terminal may be minimized by increasing volume of the decoration of the temperature sensor to increase heat capacity, and thus measurement accuracy of the temperature sensor can be improved.

The above-described present invention may be implemented as computer-readable codes on a medium on which a program is recorded. The computer-readable medium includes all kinds of recording devices in which data capable of being read by a computer system is stored. Examples of the computer-readable medium include a hard disk drive (HDD), a solid state disk (SSD), a silicon disk drive (SDD), a ROM, a RAM, a CD-ROM, a magnetic tape, a floppy disk, an optical data storage device or the like, as well as a form of a carrier wave (e.g., transmission over Internet). In addition, the computer may include a controller 180 of the terminal. Accordingly, the above detailed description should not be construed restrictively in all aspects and should be regarded as illustrative. The scope of the present invention should be determined by reasonable interpretation of the appended claims, and all changes within the equivalent scope of the present invention are included in the scope of the present invention.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in the embodiments may be varied. In addition, it should be construed that differences related to such a variation and such an application are included in the scope of the present invention defined in the following claims.

The invention claimed is:

1. A sensor module comprising:
   a flexible circuit board;
   a temperature sensor disposed on the flexible circuit board to measure a temperature of an object;
   a distance sensor disposed on the flexible circuit board adjacent to the temperature sensor and measuring a distance to the object;
   a terminal cover disposed over the temperature sensor and the distance sensor and including a first hole in which an upper surface of the temperature sensor is exposed and a second hole in which an upper surface of the distance sensor is exposed;
   a decoration surrounding a periphery of an outer surface of the temperature sensor and a periphery of an outer surface of the distance sensor, and dividing an upper region of the flexible circuit board into a first part of the upper region in which the temperature sensor is disposed and a second part of the upper region in which the distance sensor is disposed; and
   a window disposed at the second hole of the terminal cover,
   wherein an upper portion of the temperature sensor is exposed through an outside of the terminal cover by the first hole,
   wherein the decoration includes:
   an upper decoration disposed on the flexible circuit board and surrounding the periphery of the outer surface of the temperature sensor and the periphery of the outer surface of the distance sensor, and
   a lower decoration disposed under the upper decoration and surrounding a lower region of the flexible circuit board on which the temperature sensor and the distance sensor are disposed.

2. The sensor module of claim 1, wherein the upper and lower regions of the flexible circuit board on which the temperature sensor is disposed are divided from the upper and lower regions of the flexible circuit board on which the distance sensor is disposed.

3. The sensor module of claim 1, wherein the decoration is disposed to be spaced apart from the outer surface of the temperature sensor by a predetermined distance, and an air gap is formed between an inner surface of the decoration and the outer surface of the temperature sensor.

4. The sensor module of claim 1, wherein the window includes:
   a first window disposed in the second hole of the terminal cover to cover the second hole, and
   a second window extended from the first window and disposed in the first hole of the terminal cover to cover a part of the first hole.

5. The sensor module of claim 1, wherein:
   the window is disposed in the first hole and the second hole of the terminal cover to commonly cover the upper portion of the temperature sensor and an upper portion of the distance sensor; and
   the window is formed of a material capable of transmitting both infrared rays of a short wavelength and infrared rays of a long wavelength.

6. The sensor module of claim 1, wherein the window is disposed at the second hole of the terminal cover in which the upper surface of the <distance sensor is exposed, and made of a light-transmitting material that transmits light from and to the distance sensor.

7. The sensor module of claim 1, wherein the upper decoration includes:
  a first upper decoration disposed in the first hole of the terminal cover and surrounding the upper portion of the temperature sensor; and
  a second upper decoration disposed in the second hole of the terminal cover and surrounding an upper portion of the window,
  wherein the first and second upper decorations are spaced apart from each other by a predetermined distance.

8. The sensor module of claim 1, wherein the temperature sensor includes:
  a heat dissipation substrate disposed on the flexible circuit board;
  a circuit pattern disposed on the heat dissipating substrate;
  a first element and a second element disposed on the heat dissipation substrate to be electrically connected to the circuit pattern and spaced apart from each other at a predetermined distance;
  a sensor cover disposed on the heat dissipation substrate to surround the circuit pattern, the first element and the second element, and having a third hole formed in a region vertically overlapped with an upper surface of the first element; and
  a filter disposed in the third hole of the sensor cover and transmitting a wavelength band of an infrared region from the outside to provide to the first element.

9. The sensor module of claim 8, wherein an upper surface of the sensor cover lies in the same plane as an upper surface of the terminal cover and an upper surface of the window.

10. The sensor module of claim 9, wherein an upper surface of the filter is positioned at a lower level than the upper surface of the sensor cover.

11. The sensor module of claim 8, wherein at least one nitride resin of BN, AlN, $Al_2O_3$ and MgO is added to a ceramic resin in the heat dissipation substrate.

12. The sensor module of claim 1, wherein the distance sensor includes:
  a light emitting part disposed on the flexible circuit board and generating light via the window, and
  a light receiving part disposed on the flexible circuit board and receiving reflected light via a measurement object.

13. The sensor module of claim 12, wherein the distance sensor is an auto-focusing device that measures the distance to the measurement object by using a phase difference between an output signal of the light emitting part and a received signal of the light receiving part, and adjusts a photographing focus of a camera by using the measured distance.

14. The sensor module of claim 1, wherein the sensor module further includes a control element electrically connected to the temperature sensor and the distance sensor via the flexible circuit board and compensating a measured temperature via the temperature sensor based on the distance to the measurement object measured via the distance sensor.

15. The sensor module of claim 14, wherein the upper region of the flexible circuit board includes:
  a first region formed in which the temperature sensor and the distance sensor are disposed, and
  a second region spaced apart from the first region and formed in which the control element is disposed.

16. The sensor module of claim 5, wherein the window includes a fourth hole formed in a region vertically overlapped with the upper surface of the temperature sensor.

17. The sensor module of claim 16, wherein the window surrounds a periphery of an outer surface of the decoration.

18. The sensor module of claim 17,
  wherein the decoration includes a fifth hole formed in a second region vertically overlapped with an upper region of the fourth hole, and
  wherein a width of the fifth hole is same as a width of the fourth hole.

* * * * *